United States Patent
De et al.

(10) Patent No.: US 12,338,309 B2
(45) Date of Patent: Jun. 24, 2025

(54) DIELECTRIC FILM-FORMING COMPOSITION

(71) Applicant: Fujifilm Electronic Materials U.S.A., Inc., N. Kingstown, RI (US)

(72) Inventors: Binod B. De, Attleboro, MA (US); William A. Reinerth, Riverside, RI (US); Sanjay Malik, Attleboro, MA (US); Stephanie Dilocker, Attleboro, MA (US); Raj Sakamuri, Sharon, MA (US)

(73) Assignee: Fujifilm Electronic Materials U.S.A., Inc., N. Kingstown, RI (US)

( * ) Notice: Subject to any disclaimer, the term of this patent is extended or adjusted under 35 U.S.C. 154(b) by 0 days.

(21) Appl. No.: 18/594,248

(22) Filed: Mar. 4, 2024

(65) Prior Publication Data

US 2024/0254268 A1    Aug. 1, 2024

Related U.S. Application Data

(62) Division of application No. 17/352,484, filed on Jun. 21, 2021, now Pat. No. 11,945,894.

(60) Provisional application No. 63/047,560, filed on Jul. 2, 2020.

(51) Int. Cl.
| | |
|---|---|
| C08F 279/02 | (2006.01) |
| C08J 5/18 | (2006.01) |
| C08L 51/00 | (2006.01) |
| C09D 11/101 | (2014.01) |
| C09D 11/107 | (2014.01) |
| C09D 151/04 | (2006.01) |
| C25D 5/56 | (2006.01) |

(52) U.S. Cl.
CPC .............. *C08F 279/02* (2013.01); *C08J 5/18* (2013.01); *C08L 51/003* (2013.01); *C09D 11/101* (2013.01); *C09D 11/107* (2013.01); *C09D 151/04* (2013.01); *C25D 5/56* (2013.01); *C08J 2351/00* (2013.01)

(58) Field of Classification Search
CPC ........ C08F 279/02; C08J 5/18; C08J 2351/00; C08L 51/003; C25D 5/56; C09D 11/101; C09D 11/107; C09D 151/04
See application file for complete search history.

(56) References Cited

U.S. PATENT DOCUMENTS

| | | | |
|---|---|---|---|
| 3,361,674 A | 1/1968 | Barry et al. | |
| 3,595,900 A | 7/1971 | Loudas et al. | |
| 3,816,306 A | 6/1974 | Roy | |
| 3,853,815 A * | 12/1974 | Lubowitz | C08G 63/553 |
| | | | 528/109 |
| 3,858,815 A * | 1/1975 | Black | A47J 43/25 |
| | | | 241/168 |
| 4,248,986 A | 2/1981 | Lal | |
| 4,678,841 A * | 7/1987 | Yoshizawa | C08C 19/10 |
| | | | 525/333.1 |
| 4,784,785 A | 11/1988 | Cordani et al. | |
| 4,785,034 A | 11/1988 | Gaku et al. | |
| 4,894,414 A | 1/1990 | Yang et al. | |
| 5,248,398 A | 9/1993 | Cordani | |
| 5,431,776 A | 7/1995 | Richardson et al. | |
| 5,524,780 A | 6/1996 | Krulik et al. | |
| 5,650,249 A | 7/1997 | Dull et al. | |
| 5,891,804 A | 4/1999 | Havemann et al. | |
| 6,165,682 A | 12/2000 | Foster et al. | |
| 6,353,999 B1 | 3/2002 | Cheng et al. | |
| 6,399,486 B1 | 6/2002 | Chen et al. | |
| 6,803,434 B2 | 10/2004 | Dilocker et al. | |
| 6,830,870 B2 | 12/2004 | Malik et al. | |
| 6,835,953 B2 | 12/2004 | Cok et al. | |
| 6,916,543 B2 | 7/2005 | De et al. | |
| 6,929,897 B2 | 8/2005 | Foster et al. | |
| 7,303,992 B2 | 12/2007 | Paneccasio et al. | |
| 8,362,155 B2 * | 1/2013 | Kase | C08C 19/10 |
| | | | 525/333.1 |
| 9,519,216 B2 | 12/2016 | Naiini et al. | |
| 9,809,690 B2 | 11/2017 | Koes | |
| 9,822,226 B2 | 11/2017 | Chujo et al. | |
| 10,036,952 B2 | 7/2018 | Malik et al. | |
| 10,563,014 B2 | 2/2020 | Malik et al. | |
| 2003/0022097 A1 | 1/2003 | Malik et al. | |
| 2015/0017449 A1 | 1/2015 | Itoh et al. | |
| 2015/0219990 A1 | 8/2015 | Malik et al. | |
| 2016/0313642 A1 | 10/2016 | Malik et al. | |
| 2017/0175274 A1 | 6/2017 | Kim et al. | |
| 2018/0105488 A1 | 4/2018 | Katagiri et al. | |
| 2019/0016999 A1 | 1/2019 | Sakamuri et al. | |
| 2019/0018321 A1 | 1/2019 | Malik et al. | |
| 2019/0081001 A1 | 3/2019 | Malik et al. | |
| 2020/0173013 A1 | 6/2020 | Nguyen et al. | |

FOREIGN PATENT DOCUMENTS

| | | |
|---|---|---|
| EP | 0063043 | 10/1982 |
| JP | 2014205792 | 10/2014 |

OTHER PUBLICATIONS

Extended European Search Report in European Appln No. 21833452. 2, dated Jul. 1, 2024, 6 pages.
International Search Report and Written Opinion by the International Searching Authority for International Application No. PCT/US2021/038208, dated Sep. 24, 2021.
Plueddemann, "Silane Coupling Agent," 1982 Plenum Press, (abstract only).

(Continued)

*Primary Examiner* — Robert D Harlan
(74) *Attorney, Agent, or Firm* — Fish & Richardson P.C.

(57) ABSTRACT

This disclosure relates to a dielectric film-forming composition that includes at least one cyclized polydiene resin, and one or both of at least one reactive functional compound and at least one catalyst.

18 Claims, No Drawings

(56) References Cited

OTHER PUBLICATIONS

Office Action in Taiwan Appln. No. 110123199, dated Dec. 2, 2024, 4 pages (with English translation of Search Report).

* cited by examiner

DIELECTRIC FILM-FORMING COMPOSITION

CROSS-REFERENCE TO RELATED APPLICATION

The present application is a division of and claims benefit under 35 U.S.C. § 120 to U.S. patent application Ser. No. 17/352,484, filed on Jun. 21, 2021, which claims priority to U.S. Provisional Application Ser. No. 63/047,560, filed on Jul. 2, 2020. The contents of each of these priority applications are hereby incorporated by reference in their entirety.

BACKGROUND OF THE DISCLOSURE

A dielectric material with balanced electrical properties (e.g., dielectric constant Dk less than 2.8 and dissipation factor Df less than 0.007), low coefficient of thermal expansion (e.g., less than 100 ppm), low moisture absorption and good adhesion to copper are essential for excellent antenna performance, and for delivering outstanding signal transmission to ensure high-speed, low-latency for 5G communication devices. A variety of engineering plastics are being developed for use in emerging 5G networks and high power devices with such properties. However, designing dielectric materials based on balanced electrical, mechanical and thermal properties is a major challenge.

Various classes of materials such as polytetrafluoroethylene (PTFE), epoxy resin, polycycloolefins, and cyanate ester resin with and without fillers have been proposed for applications requiring good insulating properties. Although PTFE or filled PTFE is an excellent class of dielectric material, poor mechanical properties and lack of film-forming ability on most of substrates using conventional film application techniques make them impractical to use in manufacturing environment.

Filled or unfilled epoxy resins are widely used in PCB industry. However, poor electric properties due to presence of large amounts of polar groups in the materials and low glass transition temperatures (Tg) limits use of epoxy resins in high speed communication.

Cyanate ester resins generate polytriazines as thermosets on curing at elevated temperature. They possess good heat resistance, hardness, electrical properties, dimensional stability, corrosion resistance, and chemical resistance. Cyanate ester resins are useful as adhesives and as coatings for substrates. But these materials are not very suitable for dielectric films where good mechanical properties are essential for performance of material. Cyanate ester resins have been blended with thermoplastics and elastomers to form blend resins. Disadvantageously, these blends have been found to generate semi-interpenetrating networks rather than uniform resins. Formation of such semi-interpenetrating networks often result in phase separation between cyanate and modifier domains. Moreover, various elastomers modified cyanate esters exhibit low Tg and high tackiness and hence are deemed unsuitable.

Cyclized polydiene resins such as cyclized polyisoprenes possess desirable electrical properties. However, cyclized polyisoprenes have low Tg and poor mechanical properties that prevents their use as dielectric materials in packaging applications.

Hence, design of materials that possess appropriate balance of electrical, thermal and mechanical properties continues to be a challenge.

SUMMARY OF THE DISCLOSURE

This disclosure is based on the unexpected discovery that certain dielectric films containing a cyclized polydiene (e.g., a cyclized polyisoprene) and a reactive functional compound, or a cyclized polydiene and a cyanate ester, or a cyclized polydiene and both a cyanate ester and a reactive functional compound can address the problems described above. The resulting "hybrid" dielectric films described in this disclosure have a higher Tg and a lower CTE in comparison to a cyclized polydiene without a cyanate ester or a reactive functional compound.

In one aspect, this disclosure features a dielectric film-forming composition that includes:
  a) at least one cyclized polydiene resin having a substituted or unsubstituted alkenyl group;
  b) at least one reactive functional compound having at least two functional groups capable of reacting with the substituted or unsubstituted alkenyl group on cyclized polydiene resin; and
  c) at least one catalyst capable of inducing reaction of the cyclized polydiene resin with the reactive functional compound.

In another aspect, this disclosure features a dielectric film-forming composition that includes:
  a) at least one cyclized polydiene resin; and
  b) at least one cyanate ester compound containing at least two cyanate groups (i.e., in one molecule).

In still another aspect, this disclosure features a dielectric film-forming composition that includes:
  a) at least one cyclized polydiene resin having a substituted or unsubstituted alkenyl group;
  b) at least one reactive functional compound having at least two functional groups capable of reacting with the substituted or unsubstituted alkenyl group on cyclized polydiene resin;
  c) at least one cyanate ester compound containing at least two cyanate groups (i.e., in one molecule);
  d) at least one catalyst capable of inducing reaction of the cyclized polydiene resin with the reactive functional compound; and
  e) optionally, at least one solvent.

In still another aspect, this disclosure features a process of preparing a dielectric film. The process can include
  a) coating the dielectric film-forming composition described herein on a substrate to form a film;
  b) optionally baking the film at a temperature from about 50° C. to about 150° C. for about 20 seconds to about 240 seconds; and
  c) exposing the film to radiation, heat, or a combination thereof without a mask (e.g., a patterned mask).

In still another aspect, this disclosure features a process of a dry film. The process can include
  a) coating a carrier substrate with a dielectric film-forming composition described herein;
  b) drying the coated dielectric film-forming composition to form a dry film; and c) optionally, applying a protective layer to the dry film.

In still another aspect, this disclosure features a process of depositing a conducting metal layer. The process can include
  a) depositing a dielectric film-forming composition described herein on a substrate to form a dielectric film;
  b) exposing the dielectric film to radiation or heat or a combination of radiation and heat;
  c) patterning the dielectric film to form a patterned dielectric film having openings; d) optionally depositing a seed layer on the patterned dielectric film;
  e) depositing a conducting metal layer in at least one opening in the patterned dielectric film; and
  f) optionally repeating steps a) to e) at least one time.

In still another aspect, this disclosure features a process for forming a dielectric film on a substrate. The process can include
a) providing a substrate containing conducting metal wire structures that form a network of lines and interconnects on the substrate;
b) depositing a dielectric film-forming composition described herein on the substrate to form a dielectric film;
c) exposing the dielectric film to radiation or heat or a combination of radiation and heat; and
d) optionally, repeating steps a) to c) at least one time.

In yet another aspect, this disclosure features three dimensional objects that include at least one layer of conducting metal and a crosslinked dielectric film formed by using the dielectric film-forming composition of this disclosure.

DETAILED DESCRIPTION OF THE DISCLOSURE

In some embodiments, this disclosure relates to a dielectric film-forming composition (e.g., a photosensitive dielectric film-forming composition) that includes:
a) at least one (e.g., two, three or four) cyclized polydiene resin having a substituted or unsubstituted alkenyl group;
b) at least one (e.g., two, three or four) reactive functional compound having at least two functional groups capable of reacting with the substituted or unsubstituted alkenyl or olefin group on cyclized polydiene resin; and
c) at least one (e.g., two, three or four) catalyst capable of inducing a reaction of the cyclized polydiene resin with the reactive functional compound.

In some embodiments, the substituted or unsubstituted cyclized polydienes can include homopolymers of conjugated dienes such as isoprene, butadiene, pentadiene, etc. In other embodiments, the cyclized polydienes include copolymers of such conjugated dienes with olefins (e.g., ethylene or propylene), styrene or acrylates. Cyclization of polydiene occurs under influence of heat, light, ultraviolet or nuclear radiation or in the presence of cation-donor catalysts (e.g., mineral acids, organic acids, or Lewis's acids). For example, two neighboring polymer structural units can participate in a cis olefin catalyzed cyclization, which can create a monocyclic structure by eliminating one double bond. When cyclization continues, bi- or tri-cyclic structures can be created in later stages. Gradually, the unsaturation and elasticity of a polydiene is reduced as the result of successive cyclization of cis double bonds, and the toughness of the polydiene is increased. In some embodiments, the cyclization can be more efficient in polyisoprene than in polybutadiene. By controlling the temperature, catalyst concentration and/or reaction time, a cyclization degree of from about 50% to about 95% can be achieved. Examples of such cyclization process have been described in, e.g., U.S. Pat. Nos. 4,678, 841 and 4,248,986, and European Patent No. 0063043, the contents of which are hereby incorporated by reference.

In some embodiments, the viscosity of the cyclized polydiene resin in xylene at 26% solid can be from at least about 400 cSt (e.g., at least about 450 cSt, at least about 500 cSt, at least about 550 cSt, or at least about 600 cSt) to at most about 900 cSt (e.g., at most about 850 cSt, at most about 800 cSt, at most 750 cSt, or at most about 700 cSt).

The cyclized polydiene resin can have any suitable weight average molecular weight (Mw) depending on the particular product application, solvent employed, and method of applying to the underlying substrate. For example, the cyclized polydiene resin can have a weight average molecular weight of at least about 5,000 Daltons (e.g., at least about 25,000 Daltons, at least about 50,000 Daltons, at least about 75,000 Dalton, at least about 100,000 Dalton, at least about 125,000 Daltons, or at least about 150,000 Daltons) and/or at most about 500,000 Daltons (e.g., at most about 400,000 Daltons, at most about 300,000 Daltons, or at most about 200,000 Daltons).

In some embodiments, the dielectric film-forming composition described herein can include a mixture of cyclized polydiene resins. The mixture can include:
a) at least one cyclized polydiene resin with a weight average molecular weight from about 5,000 Daltons to about 20,000 Daltons;
b) at least one cyclized polydiene resin with a weight average molecular weight of from about 25,000 Daltons to about 60,000 Daltons; and
c) at least one cyclized polydiene resin with a weight average molecular weight of from about 70,000 Daltons to about 200,000 Daltons.

Without wishing to be bound by theory, it is believed that a dielectric film-forming composition containing a mixture of cyclized polydiene resins having different molecular weights can result in a dielectric film having superior coating quality and film properties.

In some embodiments, the double bond content in an uncyclized polyisoprene is 14.7 mmols unsaturation per 1 gram of polyisoprene, i.e., the inverse of the molecular weight of an isoprene unit (i.e., 68 g/mol). In general, the double bond content in a cyclized polyisoprene decreases as the degree of cyclization increases. In some embodiments, the amount of double bond or unsaturation of a cyclized polydiene resin (e.g., in xylene) can range from at least about 1 mmol (e.g., at least about 2 mmols, at least about 3 mmols, at least about 4 mmols, or at least about 5 mmols) to at most about 12 mmols (e.g., at most about 11 mmols, at least about 10 mmols, at least about 9 mmols, or at least about 8 mmols) per 1 gram of polyisoprene after cyclization.

In general, an increase of bicyclic and tricyclic structures in a cyclized polydiene resin increases the glass transition temperature (Tg) of the polydiene resin. In some embodiments, the Tg of the cyclized polydiene resin disclosed herein can be at least about 0° C. (e.g., at least about 5° C., at least about 10° C., at least about 15° C., at least about 20° C., or at least about 25° C.) and/or at most about 100° C. (e.g., at most about 90° C., at most about 80° C., at most about 70° C., at most about 60° C., or at most about 50° C.). In some embodiments, two or more cyclized polydiene resins having different properties (e.g., different unsaturation or Tg) can be used together in the dielectric film-forming composition described herein.

In some embodiments, the cyclized polydiene resin described herein can include one or more substituted or unsubstituted alkenyl group. As used herein, possible substituents on a substituted group (e.g., a substituted alkyl, alkenyl, alkylene, cycloalkyl, cycloalkylene, aryl, arylalkyl, or heteroaryl group) or a substituted compound include $C_1$-$C_{10}$ alkyl (e.g., methyl, ethyl, or propyl), halogen (F, Cl, Br, or I), cyano, and phenyl.

In some embodiments, the cyclized polydiene resin described herein can be in an amount of from at least about 2 weight % (e.g., at least about 3 weight %, at least about 4 weight %, at least about 5 weight %, at least about 8 weight %, or at least 10 weight %) to at most about 40 weight % (e.g., at most about 35 weight %, at most about weight %, at most about 25 weight %, at most about 20 weight, or at most about 15 weight %) of the total weight of the dielectric film-forming composition. Without wishing to be bound by theory, it is believed that a dielectric film prepared from a cyclized polydiene resin can have desirable electric properties (e.g., low dielectric loss tangent or dissipation factor).

In some embodiments, the reactive functional compound described herein can include at least two (e.g., three or four) functional groups capable of reacting with a substituted or unsubstituted alkenyl group on the cyclized polydiene resin to form a cross-linked dielectric film. An example of a reactive functional compound is a compound containing at least two (meth)acrylate groups, at least two olefin groups, at least two cycloolefin groups, or at least two alkynyl groups. As used herein, the term "(meth)acrylate" include both acrylates and methacrylates. Examples of compounds containing at least two cycloolefin groups include, but are not limited to, dicyclopentadiene, norbornadiene and the like. Examples of compounds containing two olefin groups include divinyl benzene, ethylene norbornene and the like. In some embodiments, compounds containing at least two (meth)acrylate groups include di(meth)acrylate of unsubstituted or substituted linear, branch or cyclic $C_1$-$C_{10}$ alkyl groups, and di(meth)acrylate of unsubstituted or substituted aromatic groups. Examples of such compounds include, but are not limited to, 1,3-butylene glycol di(meth)acrylate, 1,4-butanediol di(meth)acrylate, 1,5-pentanediol di(meth)acrylate, 1,6-hexanediol di(meth)acrylate, 1,9-nonanediol di(meth)acrylate, 1,10-decanediol di(meth)acrylate, 1,12-dodecanediol di(meth)acrylate, tetraethyleneglycol di(meth)acrylate, cyclohexane dimethanol di(meth)acrylate, tricyclodecanedimethanol diacrylate, 1,4-phenylene di(meth)acrylate, 2,2-bis[4-(2-hydroxy-3-methacryloxypropoxy)phenyl]propane, tricyclodecane dimethanol di(meth)acrylate, and trimethylol propane ethoxylate tri(meth)acrylate. Other examples of reactive functional compounds have been described in, e.g., U.S. Pat. Nos. 10,036,952; 10,563,014, and U.S. Application Publication No. 2015219990, the contents of which are hereby incorporated by reference. In some embodiments, two or more reactive functional compounds can be used together in a dielectric film-forming composition described herein.

In some embodiments, the at least one reactive functional compound can be in an amount of from at least about 1 weight % (e.g., at least about 2 weight %, at least about 3 weight %, at least about 4 weight %, or at least 5 weight %) to at most about 25 weight % (e.g., at most about 20 weight %, at most about 15 weight %, at most about 10 weight %, or at most about 8 weight %) of the total weight of dielectric film-forming composition described herein. Without wishing to be bound by theory, it is believed that the reactive functional compound can result in crosslinking in the dielectric film (e.g., upon exposure to radiation or heat), which facilitates forming a solubility contrast before and after exposure. In addition, without wishing to be bound by theory, it is believed that a dielectric film-forming composition containing a relative large amount of a reactive functional compound can result in a dielectric film having a relatively high Tg.

In some embodiments, this disclosure relates to a dielectric film-forming composition that includes:
a) at least one (e.g., two, three, or four) cyclized polydiene resin; and
b) at least one (e.g., two, three, or four) cyanate ester compound having at least two cyanate groups (i.e., in one molecule).

In some embodiments, the cyanate ester compounds can have Structure (1):

wherein m is an integer of at least 2 (i.e., m≥2) and A is a divalent organic group containing a substituted or unsubstituted aromatic group (e.g., the cyanate ester groups —O—C≡N are directly bonded to the substituted or unsubstituted aromatic organic group). In some embodiments, the aromatic group can include aryl and heteroaryl groups. The term "aryl" used herein refers to a hydrocarbon moiety having one or more aromatic rings. Examples of aryl moieties include phenyl (Ph), phenylene, naphthyl, naphthylene, pyrenyl, anthryl, and phenanthryl. The term "heteroaryl" used herein refers to a moiety having one or more aromatic rings that contain at least one heteroatom (e.g., N, O, or S). Examples of heteroaryl moieties include furyl, furylene, fluorenyl, pyrrolyl, thienyl, oxazolyl, imidazolyl, thiazolyl, pyridinyl, pyrimidinyl, quinazolinyl, quinolyl, isoquinolyl and indolyl.

In some embodiments, the cyanate ester compounds of Structure (I) can be those of Structure (II):

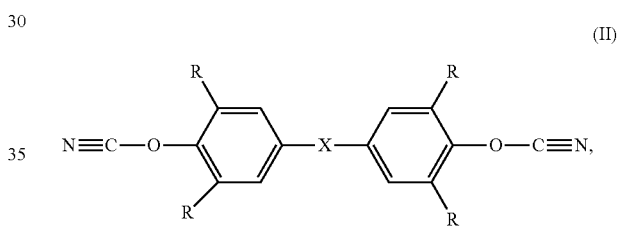

in which R is a hydrogen atom, a $C_1$-$C_3$ alkyl group, a fully or partially halogen (F, Cl, Br, or I), substituted $C_1$-$C_3$ alkyl group (e.g., substituted by 1, 2, or 3 halogen), or a halogen atom; and X is a single bond, —O—, —S—, —(C=O)—, —(C=O)—O—, —O—(C=O)—, —(S=O)—, —(SO$_2$)—, —CH$_2$CH$_2$—O—, a substituted or unsubstituted $C_1$-$C_{10}$ alkylene, a fluoro substituted (e.g., partially or fully) $C_1$-$C_4$ alkylene (e.g., substituted by 1, 2, or 3 fluoro), a substituted or unsubstituted $C_3$-$C_{10}$ cycloalkylene, or one of the following group:

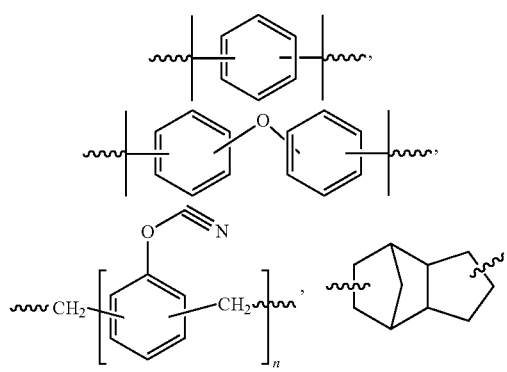

In some embodiments, the cyanate ester compounds can have Structure (III):

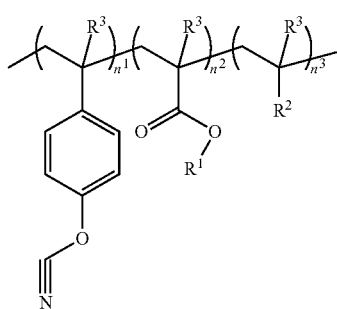

(III)

in which $n^1$ is an integer of at least 2 (i.e., $n^1 \geq 2$), $n^2$ and $n^3$ are independently 0 or an integer of from 1 to 100, $R^1$ is a $C_1$-$C_{10}$ alkyl or $C_1$-$C_{20}$ arylalkyl group (e.g., an acid sensitive/decomposable substituted alkyl or arylalkyl group), $R^2$ is a substituted or unsubstituted $C_1$-$C_{10}$ alkyl, a substituted or unsubstituted $C_3$-$C_{10}$ cycloalkyl, a substituted or unsubstituted aryl group, or a —(C=O)—$OR^4$ group where $R^4$ is a non-acid sensitive substituted alkyl or arylalkyl group; $R^3$ is a substituted or unsubstituted $C_1$-$C_{10}$ alkyl, or a fluoro substituted (e.g., partially or fully) $C_1$-$C_4$ alkyl.

Specific examples of suitable cyanate ester compounds include 2,2-bis(4-cyanatophenyl)propane, hexafluorobisphenol A dicyanate, bis(4-cyanate-3,5-dimethylphenyl)methane, 1,3-bis(4-cyanatephenyl-1-(methylethylidene))benzene, bis(4-cyanatephenyl)thioether, and bis(4-cyanatephenyl)ether; a polyfunctional cyanate ester derived from a phenol novolac, cresol novolac, or dicyclopentadiene structure-containing phenol resin, or the like. Other examples of cyanate ester compounds have been described in, e.g., U.S. Pat. Nos. 3,595,900, 4,894,414, and 4,785,034, the contents of which are hereby incorporated by reference. In some embodiments, two or more cyanate ester compounds can be used together in the dielectric film-forming composition described herein.

In general, the weight average molecular weight of the cyanate ester compound is not particularly limited. In some embodiments, the cyanate ester compound can have a weight average molecular weight ranging from at least about 500 Daltons (e.g., at least about 600 Daltons or at least about 1,000 Daltons) to at most about 4.500 Daltons (e.g., at most about 4.000 Daltons, or at most about 3.000 Daltons).

In some embodiments, the cyanate ester compound described herein can be in an amount of from at least about 1 weight % (e.g., at least about 2 weight %, at least about 3 weight %, at least about 4 weight %, or at least about 5 weight %) to at most about 25 weight % (e.g., at most about 20 weight %, at most about 15 weight %, at most about 10 weight %, or at most about 8 weight %) of the total weight of the dielectric film-forming composition described herein.

Without wishing to be bound by theory, it is believed that including one or more cyanate ester compounds in the dielectric film-forming composition described herein can be polymerized (e.g., upon heating such as in a post development baking step) to form an interpenetrating polymer network with the cyclized polydiene resin, thereby resulting in dielectric films having enhanced mechanical and thermal properties (e.g., higher Tg and lower CTE), which lead to superior reliability when incorporated in microelectronic devices.

In some embodiments, the dielectric film-forming composition of this disclosure can include at least one (e.g., two, three, or four) catalyst (e.g., an initiator). The catalyst is capable of inducing crosslinking or polymerization reaction when exposed to heat (thermal initiator) and/or a source of radiation (photoinitiator). Specific examples of thermal initiators include, but are not limited to, benzoyl peroxide, dicumyl peroxide, 2,2-azobis(2-methylbutyronitrile) and the like. Other examples of thermal initiators have been described in, e.g., U.S. Pat. No. 10,563,014, the contents of which are hereby incorporated by reference. Specific examples of photoinitiators include, but are not limited to, 2-(benzoyloxyimino)-1-[4-(phenylthio)phenyl]-1-octanone (Irgacure OXE-01 from BASF), 1-[9-ethyl-6-(2-methylbenzoyl)-9H-carbazol-3-yl]ethanone 1-(O-acetyloxime) (Irgacure OXE-2 from BASF), ethoxy(2,4,6-trimethylbenzoyl)phenyl phosphine oxide (Lucerin TPO-L from BASF), NCI-831 (ADEKA Corp.), NCI-930 (ADEKA Corp.), N-1919 (ADEKA Corp.), and the like. Other examples of photoinitiators have been described in, e.g., U.S. Pat. Nos. 10,036,952 and 10,563,014, and U.S. Patent Application Nos 2015/0219990 and 2019/0018321, the contents of which are hereby incorporated by reference.

In some embodiments, the amount of the catalyst is at least about 0.2 weight % (e.g., at least about 0.5 weight %, at least about 0.8 weight %, at least about 1.0 weight %, or at least about 1.5 weight %) and/or at most about 3.0 weight % (e.g., at most about 2.8 weight %, at most about 2.6 weight %, at most about 2.4 weight %, or at most about 2.0 weight %) of the total weight of the dielectric film-forming composition. Without wishing to be bound by theory, it is believed that the catalyst is capable of inducing reaction of the alkenyl groups on the cyclized polydiene resin with the functional groups on the reactive functional compound to form a cross-linked dielectric film.

In some embodiments, the dielectric film-forming composition of this disclosure can include at least one (e.g., two, three, or four) solvent (e.g., an organic solvent).

Examples of organic solvents include, but are not limited to, alkylene carbonates such as ethylene carbonate, propylene carbonate, butylene carbonate, and glycerin carbonate; lactones such as gamma-butyrolactone, ε-caprolactone, γ-caprolactone and δ-valerolactone; cycloketones such as cyclopentanone and cyclohexanone; linear ketones such as methyl ethyl ketone (MEK) and methyl isobutyl ketone (MIBK); esters such as n-butyl acetate; ester alcohol such as ethyl lactate; ether alcohols such as tetrahydrofurfuryl alcohol; glycol esters such as propylene glycol methyl ether acetate; glycol ethers such as propylene glycol methyl ether (PGME); cyclic ethers such as tetrahydrofuran (THF); aromatic hydrocarbons such as toluene, xylenes, mesitylene, tetralin; and pyrrolidones such as N-methyl-2-pyrrolidone. The preferred solvents are cyclohexanone, xylene, toluene and tetralin and mixture thereof.

In some embodiments, the amount of the solvent is at least about 40 weight % (e.g., at least about 45 weight %, at least about 50 weight %, at least about 55 weight %, at least about 60 weight %, or at least about 65 weight %) and/or at most about 98 weight % (e.g., at most about 95 weight %, at most about 90 weight %, at most about 85 weight %, at most about 80 weight %, or at most about 75 weight %) of the total weight of the dielectric film-forming composition.

In some embodiments, a photosensitizer can be used in the dielectric film-forming composition where the photosensitizer can absorb light in the wavelength range of 193 to 405 nm. Examples of photosensitizers include, but are not limited to, 9-methylanthracene, anthracenemethanol, acenaphthylene, thioxanthone, methyl-2-naphthyl ketone, 4-acetylbiphenyl, and 1,2-benzofluorene.

In some embodiments, the dielectric film-forming composition described herein can include at least one filler. These fillers can generally be inorganic or organic in nature. In some embodiments, the filler is selected from the group consisting of silica, alumina, titania, zirconia, hafnium oxide, CdSe, CdS, CdTe, CuO, zinc oxide, lanthanum oxide, niobium oxide, tungsten oxide, carbon blacks, graphene, carbon nanotube (CNT) and the like. Preferably, the inorganic fillers are in a granular form having an average size of from about 0.1 micron to 2.0 microns. In some embodiments, the filler is an inorganic particle containing a ferromagnetic material. Suitable ferromagnetic materials include elemental metals (such as iron, nickel, and cobalt) or their oxides, sulfides and oxyhydroxides, and intermetallics compounds such as Awaruite ($Ni_3Fe$), Wairauite (CoFe), $Co_{17}Sm_2$, and $Nd_2Fe_{14}B$. In another embodiment, the organic filler is selected from the group consisting of rubber particles, polyimide particles, polyester particles and the like. In some embodiments, the dielectric film-forming composition can include thermal conducting filler selected from a group consisting of Cu particles, diamond particles, gold particles and the like. In some embodiments, two or more fillers can be used together in the dielectric film-forming composition described herein.

In some embodiments, the filler (e.g., organic filler) can be in an amount of at least about 1 weight % (e.g., at least about 2 weight %, at least about 3 weight %, at least about 4 weight %, or at least 5 weight %) and/or at most about 50 weight % (e.g., at most about 40 weight %, at most about 30 weight %, at most about 20 weight %, or at most about 10 weight %) of the total weight of dielectric film-forming composition.

In some embodiments, the dielectric film-forming composition of this disclosure can optionally further include one or more (e.g., two, three, or four) adhesion promoters (e.g., a silane containing alkoxy groups). Suitable adhesion promoters are described in "Silane Coupling Agent" Edwin P. Plueddemann, 1982 Plenum Press, New York; and U.S. Pat. No. 9,519,216, the contents of which are hereby incorporated by reference.

In some embodiments, the amount of the optional adhesion promoter is at least about 0.5 weight % (e.g., at least about 0.8 weight %, at least about 1 weight %, or at least about 1.5 weight %) and/or at most about 4 weight % (e.g., at most about 3.5 weight %, at most about 3 weight %, at most about 2.5 weight %, or at most about 2 weight %) of the total weight of the dielectric film-forming composition of this disclosure.

The dielectric film-forming composition of this disclosure can also optionally contain one or more (e.g., two, three, or four) surfactants (e.g., ionic or non-ionic surfactants). Examples of suitable surfactants include, but are not limited to, the surfactants described in, e.g., U.S. Pat. Nos. 9,519,216 and 10,036,952; the contents of which are hereby incorporated by reference.

In some embodiments, the amount of the optional surfactant is at least about 0.005 weight % (e.g., at least about 0.01 weight % or at least about 0.1 weight %) and/or at most about 1 weight % (e.g., at most about 0.5 weight % or at most about 0.2 weight %) of the total weight of the dielectric film-forming composition.

The dielectric film-forming composition of the present disclosure can optionally contain one or more (e.g., two, three, or four) copper passivation reagents. Examples of suitable copper passivation reagents include triazole compounds, imidazole compounds and tetrazole compounds. Triazole compounds can include triazole, benzotriazole, substituted triazole, and substituted benzotriazole. Examples of such copper passivation triazoles and tetrazoles have been described in, e.g., U.S. Patent Application Nos. 2019/016999 and 2020/173013, the contents of which are hereby incorporated by reference.

The amount of the optional copper passivation agent, if employed, is at least about 0.05 weight % (e.g., at least about 0.1 weight %, at least about 0.2 weight % or at least about 0.5 weight %) and/or at most about 3.0 weight % (e.g., at most about 2.0 weight % or at most about 1.0 weight %) of the entire weight of the dielectric film-forming composition of this disclosure.

In some embodiments, the dielectric film-forming composition of this disclosure can optionally contain one or more (e.g., two, three, or four) dyes and/or one or more colorants.

In some embodiments, the dielectric film-forming composition of this disclosure can optionally contain one or more (e.g., two, three, or four) low dielectric loss resin. Examples of suitable low dielectric loss resins include, but are not limited to, polycarbonates, polystyrenes, polytetrafluoroethylenes, polycycloolefins, functionalized polycyclolefins and the like, In some embodiments, the dielectric film-forming composition of this disclosure can optionally contain one or more (e.g., two, three, or four) cyanate curing catalysts to reduce curing temperature of the dielectric film. The cyanate curing catalyst can be selected from the group consisting of metal carboxylate salts, metal acetylacetonate salts, a phenol derivative or an alcohol. The metals of the metal carboxylate salts and metal acetylacetonate salts can be selected from the group consisting of zinc, copper, manganese, cobalt, iron, nickel, aluminum, titanium, zirconium, and mixtures thereof. Examples of cyanate curing catalysts include zinc octanoate, zinc naphthenate, cobalt naphthenate, copper ocanoate, copper naphthenate, manganese octanoate and acetylacetone iron; phenol compounds such as octylphenol and nonylphenol, alcohols such as 1-butanol and 2-ethylhexanol, imidazole derivatives such as 2-methylimidazole, 2-ethyl-4-methylimidazole, 2-phenylimidazole, 2-phenyl-4,5-dihydroxymethyimidazole, benzotriazole derivatives such as 2-(2-Hydroxy-5-methylphenyl)benzotriazole, 2-(2H-Benzotriazol-2-yl)-4-methyl-6-(2-propenyl)phenol, 2-tert-Butyl-6-(5-chloro-2H-benzotriazol-2-yl)-4-methylphenol and 2-[3-2H-benzotriazole-2-yl)-4-hydroxyphenyl]ethyl methacrylate. Other examples of suitable cyanate curing catalysts have been described in, e.g., U.S. Patent Application No. 2018/0105488 and U.S. Pat. No. 9,822,226, the contents of which are hereby incorporated by reference.

In some embodiments, a film formed by the dielectric film-forming composition before crosslinking can have a glass transition temperature (Tg) at least about 25° C. (e.g., at least about 30° C., at least about 40° C., or at least about 50° C.) and/or at most about 100° C. (e.g., at most about 90° C., at most about 80° C., or at most about 70° C.).

In some embodiments, a dielectric film can be prepared by:
  a) coating the dielectric film-forming composition of the current disclosure on a substrate (e.g. a semiconductor substrate) to form a film (e.g., a dielectric film);
  b) optionally baking the film at an elevated temperature (e.g., from about 50° C. to about 150° C.) for a period of time (e.g., from about 20 seconds to about 240 seconds); and c) exposing (e.g., flood exposing without using a mask such as a patterned mask) the film to radiation, heat or a combination of both radiation and heat. In some embodiments, the dielectric film prepared by the above process (which uses a broad exposure without a mask) can be crosslinked but does not include a pattern or a relief image.

In some embodiments, a crosslinked dielectric film formed by the dielectric film-forming composition described herein (e.g., containing a cyanate ester) can have a relatively high Tg. For example, the crosslinked dielectric film described herein can have a Tg of at least about 120° C. (e.g., at least about 140° C., at least about 150° C., at least about 160° C., at least about 180° C., or at least about 200° C.) and/or at most about 300° C. (e.g., at least about 290° C., at least about 280° C., at least about 270° C., at least about 260° C., or at least about 250° C.).

In some embodiments, a crosslinked dielectric film formed by the dielectric film-forming composition described herein (e.g., containing a cyanate ester) can have a relatively low coefficient of thermal expansion (CTE). For example, the crosslinked dielectric film described herein can have a CTE of at most about 100 ppm/° C. (e.g., at most about 95 ppm/° C., at most about 90 ppm/° C., at most about 85 ppm/° C., at most about 80 ppm/° C., at most about 75 ppm/° C., at most about 70 ppm/° C., at most about 65 ppm/° C., at most about 60 ppm/° C., at most about 55 ppm/° C., or at most about 50 ppm/° C.) and at least about 10 ppm/° C. (e.g., at least about 20 ppm/° C., at least about 30 ppm/° C., or at least 40 ppm/° C.) as measured in the temperature range of 50° C. to 150° C.

In some embodiments, a crosslinked dielectric film formed by the dielectric film-forming composition described herein (e.g., containing a cyanate ester) can have a relatively low moisture permeability. For example, the crosslinked dielectric film described herein can have a moisture permeability of at most about 3 WVT/μm (e.g., at most about 2.5 VT/μm, at most about 2 VT/μm, at most about 1.5 VT/μm, at most about 1 WVT/μm, or at most about 0.8 VT/μm) and at least about 0.01 WVT/μm (e.g., at least about 0.02 WVT/μm, at least about 0.03 WVT/μm, at least about 0.04 WVT/μm, or at least 0.05 WVT/μm).

In some embodiments, this disclosure features a process for depositing a conducting metal layer (e.g., to create an embedded copper trace structure). The process can include the step of:
a) depositing the dielectric film-forming composition described herein on a substrate (e.g. a semiconductor substrate) to form a dielectric film;
b) exposing the dielectric film to a source of radiation or heat or a combination of radiation and heat (e.g., through a mask such as a patterned mask);
c) patterning the dielectric film to form a patterned dielectric film having openings; d) optionally, depositing a seed layer on the patterned dielectric film;
e) depositing a conducting metal layer in at least one opening in the patterned dielectric film; and
f) optionally, repeating steps a) to e) at least one (e.g., two, three, or four) time.

Coating methods for preparation of the dielectric film include, but are not limited to, spin coating, spray coating, roll coating, rod coating, rotation coating, slit coating, compression coating, curtain coating, die coating, wire bar coating, knife coating and lamination of dry film. Semiconductor substrates could have circular shape such as wafers or could be panels. In some embodiments, semiconductor substrates could be a silicon substrate, a copper substrate, an aluminum substrate, a silicon oxide substrate, a silicon nitride substrate, a glass substrate, an organic substrate, a copper cladded laminate or a dielectric material substrate.

Film thickness of the dielectric film of this disclosure is not particularly limited. In some embodiments, the dielectric film has a film thickness of at least about 1 micron (e.g., at least about 2 microns, at least about 3 microns, at least about 4 microns, at least about 5 microns, at least about 7 microns, at least about 10 microns, at least about microns, at least about 20 microns, at least about 25 microns, at least 50 microns or at least 100 microns) and/or at most about 5000 microns (5 mm) (e.g., at most about 4000 microns, at most about 3000 microns most about 2000 microns, at most about 1000 microns, at most about 500 microns, at most about 400 microns, at most about 300 microns, or at least 200 microns).

In some embodiments, the dielectric film-forming composition of this disclosure is photopatternable. In such embodiments, the process to prepare a patterned dielectric film includes converting the dielectric film prepared from the dielectric film-forming composition into a patterned dielectric film by a lithographic process. In such cases, the conversion can include exposing the dielectric film to high energy radiation (such as electron beams, ultraviolet light, and X-ray) using a patterned mask.

After the exposure, the dielectric film can optionally be heat treated to at a temperature of at least about 50° C. (e.g., at least about 55° C., at least about 60° C., or at least about 65° C.) to at most about 100° C. (e.g., at most about 95° C., or at most about 90° C., at most about 85° C., at most about 80° C., at most about 75° C., or at most about 70° C.) for at least about 60 seconds (e.g., at least about 80 seconds, or at least about 100 seconds) to at most about 240 seconds (e.g., at most about 180 seconds, at most about 120 seconds or at most about 90 seconds). The heat treatment is usually accomplished by use of a hot plate or oven.

After the exposure and/or heat treatment, the dielectric film can be developed to remove unexposed portions by using a developer to form openings or a relief image on the substrate. Development can be carried out by, for example, an immersion method or a spraying method. Microholes and fine lines can be generated in the dielectric film on the laminated substrate after development.

In some embodiments, the dielectric film can be developed by using an organic developer. Examples of such developers include, but are not limited to, cyclohexanone, xylene, toluene, tetralin, gamma-butyrolactone (GBL), dimethyl sulfoxide (DMSO), N,N-diethylacetamide, methyl ethyl ketone (MEK), methyl isobutyl ketone (MIBK), 2-heptanone, cyclopentanone (CP), cyclohexanone, n-butyl acetate (nBA), propylene glycol methyl ether acetate (PGMEA), propylene glycol methyl ether (PGME), ethyl lactate (EL), propyl lactate, 3-methyl-3-methoxybutanol, tetralin, isophorone, ethylene glycol monobutyl ether, diethylene glycol monoethyl ether, diethylene glycol monoethyl ether acetate, diethylene glycol dimethyl ether, diethylene glycol methylethyl ether, triethylene glycol monoethyl ether, dipropylene glycol monomethyl ether, methyl 3-methoxypropionate, ethyl 3-ethoxypropionate, diethyl malonate, ethylene glycol, 1,4:3,6-dianhydrosorbitol, isosorbide dimethyl ether, 1,4:3,6-dianhydrosorbitol 2,5-diethyl ether (2,5-diethylisosorbide) and mixtures thereof. Preferred developers are cyclohexanone, xylene, toluene and tetralin. These developers can be used individually or in combination of two or more to optimize the image quality for the particular composition and lithographic process.

In some embodiments, the composition of this disclosure is not photopatternable. In such cases, patterning can be accomplished by mechanical laser drilling or by a bilayer process. Laser drilling generally involves a stationary laser beam that uses its high power density to melt or vaporize materials from the target substrate or workpiece. In principle, laser drilling is governed by an energy balance between the irradiating energy from the laser beam and the conduction heat into the substrate, the energy losses to the environment, and the energy required for a phase change in the workpiece. Examples of mechanical laser drilling described in, e.g., U.S. Pat. No. 6,353,999; the contents of which are hereby incorporated by reference.

In some embodiments, the patterning is accomplished by using a bilayer process. In such cases, a photoresist film can be deposited at the top of the dielectric film of this disclosure. The photoresist film can be patterned and the pattern can be transferred to the dielectric film of this disclosure by etching. Examples of suitable photoresists have been described in, e.g., U.S. Pat. Nos. 6,803,434 and 6,830,870, and U.S. Application Publication Nos 2003/022097 and 2019/018321; the contents of which are hereby incorporated by reference.

In a preferred embodiment, the top layer of a bilayer is a silicon containing resist layer.

In some embodiments, the silicon containing resist layer described herein can be prepared from a resist forming composition containing a) at least one silicon containing polymer; b) at least one solvent (such as those described herein); and c) at least one photoacid generator (PAG).

Any suitable photoacid generators (particularly nitrobenzyl esters and onium sulfonate salts) that generate acid under the effects of active radiation from exposure sources ranging from election beam, ArF excimer lasers and KrF excimer lasers can be used together with the silicon containing polymers described herein to prepare radiation-sensitive photoresist compositions.

Suitable onium sulfonate salts can include aryl sulfonium and iodonium sulfonates, especially triaryl sulfonium and iodonium sulfonates. The aryl groups of the sulfonium or iodonium moieties can be substituted or unsubstituted aryl groups, such as phenyl or naphthyl, each of which is optionally substituted by one or more substituents such as halogen, $C_{1-4}$ alkyl, $C_{1-4}$ alkoxy, —OH, and/or nitro. The aryl groups or substituents on each aryl group can be the same or different.

The anion of the photoacid generator can be any suitable anion of a suitable organic sulfonic acid, such as aliphatic, cycloaliphatic, carbocyclic-aromatic, heterocyclic-aromatic or arylaliphatic sulfonic acids. These anions can be substituted or unsubstituted. Partially fluorinated or perfluorinated sulfonic acid derivatives or sulfonic acid derivatives substituted in the neighboring position to the respective acid group are preferred. Examples of substituents include halogens (e.g., F or Cl), alkyl (e.g., methyl, ethyl, or n-propyl), and alkoxy (e.g., methoxy, ethoxy, or n-propoxy).

Preferably, the anion of the photoacid generator is a monovalent anion from a partially fluorinated or perfluorinated sulfonic acid, such as fluorinated alkyl sulfonate anions.

Specific examples of suitable onium salts include triphenylsulfonium bromide, triphenylsulfonium chloride, triphenylsulfonium iodide, triphenylsulfonium methane sulfonate, triphenylsulfonium trifluoromethane sulfonate, triphenylsulfonium hexafluoro-propane sulfonate, triphenylsulfonium nonafluorobutane sulfonate, triphenylsulfonium phenyl sulfonate, triphenylsulfonium 4-methylphenyl sulfonate, triphenylsulfonium 4-methoxyphenyl sulfonate, triphenylsulfonium 4-chlorophenyl sulfonate, triphenylsulfonium camphorsulfonate, 4-methylphenyl-diphenylsulfonium trifluoromethane sulfonate, bis(4-methylphenyl)-phenylsulfonium trifluoromethane sulfonate, tris-4-methylphenylsulfonium trifluoromethane sulfonate, 4-tert-butylphenyl-diphenylsulfonium trifluoromethane sulfonate, 4-methoxyphenyl-diphenylsulfonium trifluoromethane sulfonate, mesityl-diphenylsulfonium trifluoromethane sulfonate, 4-chlorophenyldiphenyl-sulfonium trifluoromethane sulfonate, bis-(4-chlorophenyl)-phenylsulfonium trifluoro-methane sulfonate, tris-(4-chlorophenyl) sulfonium trifluoromethane sulfonate, 4-methyl-phenyl-diphenylsulfonium hexafluoropropane sulfonate, bis(4-methylphenyl)-phenyl-sulfonium hexafluoropropane sulfonate, tris-4-methylphenylsulfonium hexafluoro-propane sulfonate, 4-tert-butylphenyl-diphenylsulfonium hexafluoropropane sulfonate, 4-methoxyphenyl-diphenylsulfonium hexafluoropropane sulfonate, mesityl-diphenyl-sulfonium hexafluoropropane sulfonate, mesityl-diphenylsulfonium nonafluorooctane sulfonate, mesityl-diphenylsulfonium perfluorobutane sulfonate, 4-chlorophenyl-diphenylsulfonium hexafluoropropane sulfonate, bis-(4-chlorophenyl)-phenylsulfonium hexafluoropropane sulfonate, tris-(4-chlorophenyl) sulfonium hexafluoropropane sulfonate, diphenyliodonium trifluoromethane sulfonate, diphenyliodonium hexafluoropropane sulfonate, diphenyliodonium 4-methylphenyl sulfonate, bis-(4-tert-butylphenyl)iodonium trifluoromethane sulfonate, bis-(4-tert-butyl-phenyl)iodonium hexafluoropropane sulfonate, bis-(4-cyclohexylphenyl)iodonium trifluoromethane sulfonate, tris(4-tert-butylphenyl)sulfonium perfluorooctane sulfonate, and bis-(4-cyclohexylphenyl)iodonium hexafluoropropane sulfonate. A preferred example is triphenylsulfonium trifluoromethane sulfonate (triphenyl sulfonium triflate).

In some embodiments, the amount of the PAG is at least about 0.1 weight % (e.g., at least about 0.2 weight %, at least about 0.5 weight %, at least about 1 weight %, at least about 2 weight %, or at least about 3 weight %) and/or at most about 10 weight % (e.g., at most about 9 weight %, at most about 8 weight %, at most about 7 weight %, at most about 6 weight %, or at most about 5 weight %) of the entire weight of the resist forming composition.

An example of the silicon containing polymer is a tetrapolymer containing the following four monomer repeating units:

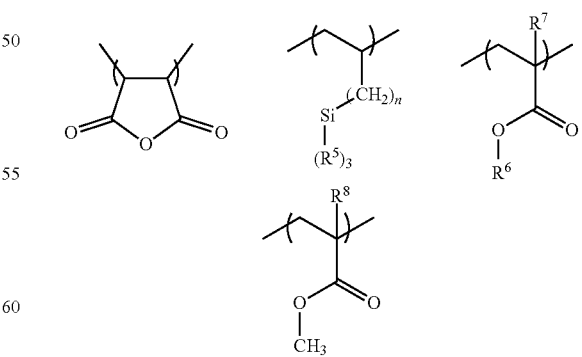

wherein n is an integer of 1 to 5, $R^5$ is a methyl or trimethylsiloxy group; $R^6$ is a tert-butyl group; and $R^7$ and $R^8$ are each independently selected from hydrogen or a methyl group. Preferably, n is equal to 1.

In some embodiments, the silicon containing polymer can be prepared by polymerization of one or more of the following monomers:

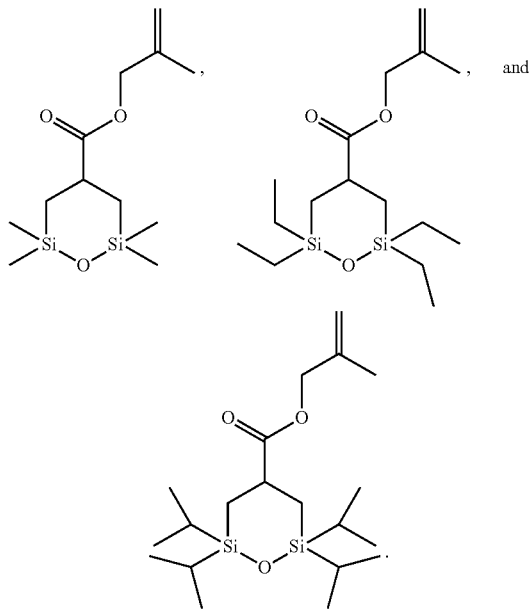

Other examples of suitable silicon containing polymers are described in U.S. Pat. Nos. 6,929,897, 6,916,543 and 6,165,682, which are incorporated herein by reference.

In some embodiments, the amount of the silicon containing polymer is at least about 1 weight % (e.g. at least about 2 weight %, at least about 5 weight %, at least about 8 weight %, at least about 10 weight %, or at least about 12 weight %) and/or at most about 30 weight % (e.g., at most about 27 weight %, at most about 25 weight % at most about 23 weight %, at most about 20 weight %, or at most about 15 weight %) of the entire weight of the resist forming composition.

In some embodiments, the amount of the solvent is at least about 60 weight % (e.g., at least about 65 weight %, at least about 70 weight %, at least about 75 weight %, at least about 80 weight %, or at least about 85 weight %) and/or at most about 98 weight % (e.g., at most about 96 weight %, at most about 94 weight %, at most about 92 weight %, at most about 90 weight %, or at most about 85 weight %) of the entire weight of the resist forming composition.

Some embodiments of this disclosure describe a process to deposit a metal layer (e.g., an electrically conducting copper layer to create an embedded copper trace structure) on a semiconductor substrate. In some embodiment, to achieve this, a seed layer conformal to the patterned dielectric film is first deposited on the patterned dielectric film (e.g., outside the openings in the film). Seed layer can contain a barrier layer and a metal seeding layer (e.g., a copper seeding layer). In some embodiments, the barrier layer is prepared by using materials capable of preventing diffusion of an electrically conducting metal (e.g., copper) through the dielectric layer. Suitable materials that can be used for the barrier layer include, but are not limited to, tantalum (Ta), titanium (Ti), tantalum nitride (TiN), tungsten nitride (WN), and Ta/TaN. A suitable method of forming the barrier layer is sputtering (e.g., PVD or physical vapor deposition). Sputtering deposition has some advantages as a metal deposition technique because it can be used to deposit many conducting materials, at high deposition rates, with good uniformity and low cost of ownership. Conventional sputtering fill produces relatively poor results for deeper, narrower (high-aspect-ratio) features. The fill factor by sputtering deposition has been improved by collimating the sputtered flux. Typically, this is achieved by inserting between the target and substrate a collimator plate having an array of hexagonal cells.

Next step in the process is metal seeding deposition. A thin metal (e.g., an electrically conducting metal such as copper) seeding layer can be formed on top of the barrier layer in order to improve the deposition of the metal layer (e.g., a copper layer) formed in the succeeding step.

Next step in the process is depositing an electrically conducting metal layer (e.g., a copper layer) on top of the metal seeding layer in the openings of the patterned dielectric film wherein the metal layer is sufficiently thick to fill the openings in the patterned dielectric film. The metal layer to fill the openings in the patterned dielectric film can be deposited by plating (such as electroless or electrolytic plating), sputtering, plasma vapor deposition (PVD), and chemical vapor deposition (CVD). Electrochemical deposition is generally a preferred method to apply copper since it is more economical than other deposition methods and can flawlessly fill copper into the interconnect features. Copper deposition methods generally should meet the stringent requirements of the semiconductor industry. For example, copper deposits should be uniform and capable of flawlessly filling the small interconnect features of the device, for example, with openings of 100 nm or smaller. This technique has been described, e.g., in U.S. Pat. No. 5,891,804 (Havemann et al.), U.S. Pat. No. 6,399,486 (Tsai et al.), and U.S. Pat. No. 7,303,992 (Paneccasio et al.), the contents of which are hereby incorporated by reference.

In some embodiments, the process of depositing an electrically conducting metal layer further includes removing overburden of the electrically conducting metal or removing the seed layer (e.g., the barrier layer and the metal seeding layer). In some embodiments, the overburden of the electrically conducting metal layer (e.g., a copper layer) is at most about 3 microns (e.g., at most about 2.8 microns, at most about 2.6 microns, at most about 2.4 microns, at most about 2.2 microns, at most about 2.0 microns, or at most about 1.8 microns) and at least about 0.4 micron (e.g., at least about 0.6 micron, at least about 0.8 micron, at least about 1.0 micron, at least about 1.2 micron, at least about 1.4 micron or at least about 1.6 microns). Examples of copper etchants for removing copper overburden include an aqueous solution containing cupric chloride and hydrochloric acid or an aqueous mixture of ferric nitrate and hydrochloric acid. Examples of other suitable copper etchants include, but are not limited to, the copper etchants described in U.S. Pat. Nos. 4,784,785, 3,361,674, 3,816,306, 5,524,780, 5,650, 249, 5,431,776, and 5,248,398, and US Application Publication No. 2017175274, the contents of which are hereby incorporated by reference.

Some embodiments describe a process for surrounding a metal structured substrate containing conducting metal (e.g., copper) wire structures forming a network of lines and interconnects with the dielectric film of this disclosure. The process can include the steps of:

a) providing a substrate containing conducting metal wire structures that form a network of lines and interconnects on the substrate;

b) depositing a dielectric film-forming composition of this disclosure on the substrate to form a dielectric film (e.g., that covers the conducting metal lines and interconnects);

c) exposing the film to a source of radiation or heat or combination of radiation and heat (which can crosslink the film); and d) optionally, repeating steps a) to c) at least one (e.g., two, three, or four) time. In some embodiments, the above process can further include patterning the dielectric film by a suitable process, such as a lithographic process, a laser ablation or drilling process, or a bilayer process (such as those described herein).

In some embodiments, this disclosure features a method of preparing a dry film structure. The method can include:

a) coating a carrier substrate (e.g., a substrate including at least one plastic film) with a dielectric film-forming composition described herein;

b) drying the coated dielectric film-forming composition to form a dry film; and c) optionally, applying a protective layer to the dry film.

In some embodiments, the carrier substrate is a single or multiple layer plastic film, which can include one or more polymers (e.g., polyethylene terephthalate). In some embodiments, the carrier substrate has excellent optical transparency and it is substantially transparent to actinic irradiation used to form a relief pattern in the polymer layer. The thickness of the carrier substrate is preferably in the range of at least about microns (e.g., at least about 15 microns, at least about 20 microns, at least about 30 microns, at least about 40 microns, at least about 50 microns or at least about 60 microns) to at most about 150 microns (e.g., at most about 140 microns, at most about 120 microns, at most about 100 microns, at most about 90 microns, at most about 80 microns, or at most about 70 microns).

In some embodiments, the protective layer is a single or multiple layer film, which can include one or more polymers (e.g., polyethylene or polypropylene). Examples of carrier substrates and protective layers have been described in, e.g., U.S. Application Publication No. 2016/0313642, the contents of which are hereby incorporated by reference.

In some embodiments, the dielectric film of the dry film can be delaminated from carrier layer as a self-standing dry film. A self-standing dry film is a film that can maintain its physical integrity without using any support layer such as a carrier layer. In some embodiments, a self-standing dielectric dry film is not crosslinked or cured and can include the components of the dielectric film-forming composition described herein except for the solvent.

In some embodiments, the dielectric film prepared from a dielectric film-forming composition described herein can have a relatively low dielectric loss tangent. For example, the dielectric loss tangent of the dielectric film (e.g., a crosslinked or uncrosslinked dielectric film) prepared from a dielectric film-forming composition of this disclosure measured at 10 GHz can be in the range of from at least about 0.001 (e.g., at least about 0.005, at least about 0.01, or at least about 0.05) to at most about 0.1 (e.g., at most about 0.08, at most about 0.06, at most about 0.05, at most about 0.04, or at most about 0.020).

In some embodiments, this disclosure features three dimensional objects, that include at least one layer of conducting metal and a dielectric film (e.g., a crosslinked, patterned dielectric film) formed by using film forming composition of this disclosure. In some embodiments, the three dimensional object can include dielectric films in at least two stacks (e.g., at least three stacks).

The contents of all publications cited herein (e.g., patents, patent application publications, and articles) are hereby incorporated by reference in their entirety.

The following examples are provided to illustrate the principles and practice of the present disclosure more clearly. It should be understood that the present disclosure is not limited to the examples described.

EXAMPLES

Example 1: Preparation and Application of Dielectric Film-Forming Composition 1

Dielectric film-forming composition of this example was prepared by mixing SC Rubber which is a cyclized polyisoprene and supplied by Fujifilm Electronic Materials U.S.A. (62.60 g of 28.5% solution in xylene), tricyclodecanedimethanol diacrylate (7.14 g), and dicumyl peroxide (0.53 g) to obtain a homogeneous solution. The solution was filtered by using a 5.0 microns PTFE filter.

In this Example, SC rubber was used as a cyclized polydiene, tricyclodecanedimethanol diacrylate was used as a reactive functional compound, dicumyl peroxide was used as thermal initiator, and xylene was used as a solvent.

The dielectric film-forming composition 1 was applied on a 35 microns thick PET film using an applicator to form a film. The film was baked at 95° C. for 10 minutes using a hot plate to remove the majority of the solvent. The film was then baked at 150° C. for 1 hour under nitrogen to achieve a stable dielectric film with a thickness of 130 microns. After the dielectric film was lifted from the PET film, it was placed on a 25 micron KAPTON film and then baked at 200° C. for an additional 1 hour under nitrogen.

After cooling to room temperature, the dielectric film was removed from the KAPTON film and slitted to form 3 mm width films, which were analyzed by TMA for thermomechanical properties. The dielectric film of this example had a Tg of 120° C. and a CTE of 88 ppm/° C. as measured in the range of 50° C. to 150° C.

Example 2: Preparation and Application of Dielectric Film-Forming Composition 2

Dielectric film-forming composition of this example was prepared by mixing a cyclized polyisoprene, which is SC Rubber supplied by Fujifilm Electronic Materials U.S.A., (43.6 g of 28.5% solution in xylene), tricyclodecanedimethanol diacrylate (5.0 g), and dicumyl peroxide (0.37 g), silica (46.9 g, Silica nanoparticles SUPSIL™ PREMIUM dispersed in 20% xylene, monodisperse, charge-stabilized supplied by Superior Silica), and xylene (3.5 g) to obtain a homogeneous solution. The solution was filtered by using a 5.0 microns PTFE filter.

In this example, SC rubber was used as a cyclized polydiene, tricyclodecanedimethanol diacrylate was used as a reactive functional compound, dicumyl peroxide was used as thermal initiator, silica nanoparticles were used as a filler, and xylene was used as a solvent.

The dielectric film-forming composition 2 was applied on a 35 microns thick PET film using an applicator to form a film. The film was baked at 95° C. for 10 minutes using a hot plate to remove the majority of the solvent. The film was then baked at 150° C. for 1 hour under nitrogen to achieve a stable dielectric film with a thickness of 130 microns After the dielectric film was lifted from the PET film, it was placed on a 25 micron KAPTON film and then baked at 200° C. for additional 1 hour under nitrogen.

After cooling to room temperature, the dielectric film was removed from the KAPTON film and slitted to form 3 mm width films, which was analyzed by TMA for thermomechanical properties. The dielectric film of this example had a Tg of 120° C. and a CTE of 58 ppm/° C. as measured in the range of 50° C. to 150° C.

Example 3: Preparation and Application of Dielectric Film-Forming Composition 3

Dielectric film-forming composition of this example is prepared by mixing a cyclized polyisoprene (SC Rubber supplied by Fujifilm Electronic Materials U.S.A., 57.90 solution of 28.5% in xylene), 2,2-bis(4-cyanatophenyl)propane (8.25 g), dicumyl peroxide (0.50 g), and xylene (1.75 g) to obtain a homogeneous solution. The solution is filtered by using a 5.0 micron PTFE filter.

In this Example, SC rubber is used as a cyclized polydiene; 2,2-bis(4-cyanatophenyl)propane is used as a cyanate ester compound, dicumyl peroxide is used as a thermal initiator, and xylene is used as a solvent.

The dielectric film-forming composition 3 is applied on a 35 micron thick PET using an applicator to form a film. The film is baked at 95° C. for 10 minutes using a hot plate to remove majority of the solvent. The film is baked at 150° C. for 1 hour under nitrogen to achieve a stable dielectric film with a thickness of 120 micron. After the dielectric film is lifted from the PET film, it is placed on a 25 micron KAPTON film and then baked at 200° C. for additional 1 hour under nitrogen.

After cooling to room temperature, the dielectric film is removed from the KAPTON film and slitted to form 3 mm width films, which are analyzed by TMA for thermomechanical properties.

Example 4: Preparation and Application of Dielectric Film-Forming Composition 4

Dielectric film-forming composition of this example was prepared by mixing a cyclized polyisoprene (SC Rubber supplied by Fujifilm Electronic Materials U.S.A., 57.90 g of 28.5% solution in xylene), tricyclodecanedimethanol diacrylate (6.60 g), 2,2-bis(4-cyanatophenyl)propane (8.25 g), dicumyl peroxide (0.50 g), and xylene (1.75 g) to obtain a homogeneous solution. The solution was filtered by using a 5.0 micron PTFE filter.

In this example, SC rubber was used as a cyclized polydiene; tricyclodecanedimethanol diacrylate was used as a reactive functional compound; 2,2-bis(4-cyanatophenyl) propane was used as a cyanate ester compound; dicumyl peroxide was used as a thermal initiator and xylene was used as a solvent.

The dielectric film-forming composition 4 was applied on a 30 micron thick PET film using an applicator to form a film. The film was baked at 95° C. for 12 minutes using a hot plate to remove the majority of the solvent. The film was baked at 200° C. for 70 minutes under nitrogen to achieve a stable dielectric film with a thickness of 250 microns. After, the dielectric film was lifted from the PET film, it was placed on a 25 micron KAPTON film and then baked at 250° C. for additional 1 hour under nitrogen.

After cooling to room temperature, the dielectric film was removed from the KAPTON film and slitted to form 3 mm width films, which were analyzed by TMA for thermomechanical properties. The dielectric film of this example had a Tg of 167° C. and a CTE of 76 ppm/° C. as measured in the range of 50° C. to 150° C.

Example 5: Preparation and Application of Dielectric Film-Forming Composition 5

Dielectric film-forming composition of this example was prepared by mixing a cyclized polyisoprene (SC Rubber supplied by Fujifilm Electronic Materials U.S.A., 57.90 g of 28.5% solution in xylene), tricyclodecanedimethanol diacrylate (4.1 g), 2,2-bis(4-cyanatophenyl)propane (11.0 g), dicumyl peroxide (0.50 g), and xylene (1.75 g) to obtain a homogeneous solution. The solution was filtered by using a 5.0 micron PTFE filter.

In this Example, SC rubber was used as a cyclized polydiene: tricyclodecanedimethanol diacrylate was used as a reactive functional compound; 2,2-bis(4-cyanatophenyl) propane was used as a cyanate ester compound; dicumyl peroxide was used as a thermal initiator, and xylene was used as a solvent.

The dielectric film-forming composition 5 was applied on a 30 micron thick PET film using an applicator to form a film. The film was baked at 95° C. for 12 minutes using a hot plate to remove the majority of the solvent. The film was then baked at 200° C. for 70 minutes under nitrogen to achieve a stable dielectric film with a thickness of 250 microns. After the dielectric film was lifted from the PET film, it was placed on a 25 micron KAPTON film and then baked at 250° C. for additional 1 hour under nitrogen.

After cooling to room temperature, the dielectric film was removed from the KAPTON film and slitted to form 3 mm width films and analyzed by TMA for thermomechanical properties. The dielectric film of this example had a Tg of 175° C. and a CTE of 67 ppm/° C. as measured in the range of 50° C. to 150° C.

Example 6: Preparation and Application of Dielectric Film-Forming Composition 6

Dielectric film-forming composition of this example was prepared by mixing a cyclized polyisoprene (SC Rubber supplied by Fujifilm Electronic Materials U.S.A., 57.90 g of 28.5% solution of in xylene), tricyclodecanedimethanol diacrylate (6.60 g), 2,2-bis(4-cyanatophenyl)propane (8.25 g), silica (12.0 g, Silica nanoparticles SUPSIL™ PREMIUM, monodisperse, charge-stabilized supplied by Superior Silica), dicumyl peroxide (0.50 g), and xylene (1.75 g) to obtain a homogeneous solution. The solution was filtered by using a 5.0 micron PTFE filter.

In this Example, SC rubber was used as a cyclized polydiene, silica nanoparticle was used as an inorganic particle filler, tricyclodecanedimethanol diacrylate was used as a reactive functional compound, 2,2-bis(4-cyanatophenyl)propane was used as a cyanate ester compound, dicumyl peroxide was used as a thermal initiator, and xylene was used as a solvent.

The dielectric film-forming composition 6 was applied on a 35 micron thick PET film using an applicator to form a film. The film was baked at 105° C. for 7 minutes using a hot plate to remove the majority of the solvent. The film was then baked at 160° C. for 185 minutes under nitrogen to achieve a stable dielectric film with a thickness of 350 microns. After the dielectric film was lifted from the PET film, it was placed on a 25 micron KAPTON film and then baked at 210° C. for additional 1 hour under nitrogen.

After cooling to room temperature, the dielectric film was removed from the KAPTON film and slitted to form 3 mm width films and analyzed by TMA for thermomechanical properties.

The dielectric film of this example had a Tg of 173° C. and a CTE of 67 ppm/° C. as measured in the range of 50° C. to 150° C.

Example 7: Preparation and Application of Dielectric Film-Forming Composition 7

Dielectric film-forming composition of this example was prepared by mixing a cyclized polyisoprene (SC Rubber supplied by Fujifilm Electronic Materials U.S.A., 57.90 g of 28.5% solution in xylene), tricyclodecanedimethanol diacrylate (6.60 g), 2,2-bis(4-cyanatophenyl)propane (8.25 g), dicumyl peroxide (0.50 g), 2-hydroxy-5-acrylyloxyphenyl-2H-benzotriazoles (0.11 g) and xylene (1.75 g) to obtain a homogeneous solution. The solution was filtered by using a 5.0 micron PTFE filter.

In this example, SC rubber was used as a cyclized polydiene; tricyclodecanedimethanol diacrylate was used as a reactive functional compound; 2,2-bis(4-cyanatophenyl)propane was used as a cyanate ester compound; dicumyl peroxide was used as a thermal initiator; 2-hydroxy-5-acrylyloxyphenyl-2H-benzotriazoles was used as a Cu corrosion inhibitor and cyanate curing catalyst; and xylene was used as a solvent.

The dielectric film-forming composition 7 was applied on a 30 micron thick PET film using an applicator to form a film. The film was baked at 95° C. for 12 minutes using a hot plate to remove the majority of the solvent. The film was then baked at 200° C. for 70 minutes under nitrogen to achieve a stable dielectric film with a thickness of 250 microns. After the dielectric film was lifted from the PET film, it was placed on a 25 micron KAPTON film and then baked at 250° C. for additional 1 hour under nitrogen.

After cooling to room temperature, the dielectric film was removed from KAPTON film and slitted to form 3 mm width films, which were analyzed by TMA for thermomechanical properties.

Example 8: Preparation and Application of Dielectric Film-Forming Composition 8

Dielectric film-forming composition of this example was prepared by mixing a cyclized polyisoprene (SC Rubber supplied by Fujifilm Electronic Materials U.S.A., 62.60 g of 28.5% solution in xylene), tricyclodecanedimethanol diacrylate (7.14 g), 2,2-bis(4-cyanatophenyl)propane (4.46 g), 2-(benzoyloxyimino)-1-[4-(phenylthio)phenyl]-1-octanone (Irgacure OXE-01 from BASF) (0.53 g), and xylene (0.25 g) to obtain a homogeneous solution. The solution was filtered by using a 5.0 micron PTFE filter.

In this example, SC rubber was used as a cyclized polydiene, tricyclodecanedimethanol diacrylate was used as a reactive functional compound; 2,2-bis(4-cyanatophenyl)propane was used as a cyanate ester compound; Irgacure® OXE01 was used as a photoinitiator; and xylene was used as a solvent.

The dielectric film-forming composition 8 was applied on a 35 micron thick PET film using an applicator to form a film. The film was baked at 95° C. for 10 minutes using a hot plate to remove the majority of the solvent. The film was then baked at 150° C. for 1 hour under nitrogen to achieve a stable dielectric film with a thickness of 130 micron. After the dielectric film was lifted from the PET film, it was placed on a 25 micron KAPTON film and then baked at 200° C. for additional 1 hour under nitrogen.

After cooling to room temperature, the dielectric film was removed from the KAPTON film and slitted to form 3 mm width films, which were analyzed by TMA for thermomechanical properties.

Example 9: Preparation and Application of Dielectric Film-Forming Composition 9

Dielectric film-forming composition of this example is prepared by mixing a cyclized polyisoprene (SC Rubber supplied by Fujifilm Electronic Materials U.S.A., 77.2 g of 28.5% solution in xylene), hexane dicrylate (4.40 g), 2,2-bis(4-cyanatophenyl)propane (11.00 g), Irgacure® OXE01 (0.66 g), 5-methyl benzotriazole (MBTA, 0.11 g), methacryloxypropyltrimethoxy silane (0.33 g) and xylene (6.5 g) to obtain a homogeneous solution. The solution is filtered by using a 5.0 micron PTFE filter.

In this example, SC rubber is used as a cyclized polydiene, hexane dicrylate is used as a reactive functional compound, 2,2-bis(4-cyanatophenyl)propane is used as a cyanate ester. Irgacure® OXE01 is used as a photoinitiator, 5-methyl benzotriazole is used as a copper passivation reagent, methacryloxypropyltrimethoxy silane is used as an adhesion promoter, and xylene is used as a solvent.

The dielectric film-forming composition 9 is applied on a 35 micron thick PET film using an applicator to form a film. The film is baked at 90° C. for 8 minutes using a hot plate to remove the majority of the solvent. The film is then baked at 175° C. for 90 minutes under nitrogen to achieve a stable dielectric film with a thickness of 100 microns. After the dielectric film is lifted from the PET film, it is placed on a 25 micron KAPTON film and then baked at 220° C. for additional 1 hour under nitrogen.

After cooling to room temperature, the dielectric film is removed from the KAPTON film and slitted to form 3 mm width films, which are analyzed by TMA for thermomechanical properties.

Example 10: Preparation and Application of Dielectric Film-Forming Composition 10

Dielectric film-forming composition of this example is prepared by mixing a cyclized polyisoprene (SC Rubber supplied by Fujifilm Electronic Materials U.S.A., 77.20 g of 28.5% solution in xylene), tricyclodecanedimethanol diacrylate (4.40 g), 2,2-bis(4-cyanatophenyl)propane (11.00 g), Mitsubishi silica (5.50 g), Irgacure® OXE01, (0.67 g), 2-[3-2H-benzotriazole-2-yl)-4-hydroxyphenyl] ethyl methacrylate (BTZ-AC, (0.11 g), methacryloxypropyltrimethoxy silane (0.33 g) and xylene (6.7 g) to obtain a homogeneous solution. The solution is filtered by using a 5.0 micron PTFE filter.

In this example, SC rubber is used as a cyclized polydiene, tricyclodecanedimethanol diacrylate is used as a reactive functional compound, 2,2-bis(4-cyanatophenyl)propane is used as a cyanate ester, Mitsubishi silica is used as a filler, Irgacure® OXE01 is used as a photoinitiator, 2-[3-2H-benzotriazole-2-yl)-4-hydroxyphenyl] ethyl methacrylate is used as a copper corrosion inhibitor, methacryloxypropyltrimethoxy silane is used as an adhesion promoter, and xylene is used as a solvent.

The dielectric film-forming composition 10 is applied on a 35 micron thick PET film using an applicator to form a film. The film is baked at 85° C. for 15 minutes using a hot plate to remove the majority of the solvent. The film is then baked at 180° C. for 75 minutes under nitrogen to achieve a stable dielectric film with a thickness of 150 microns. After the dielectric film is lifted from the PET film, it is placed on a 25 micron KAPTON film and was then baked at 250° C. for additional 30 minutes under nitrogen.

After cooling to room temperature, the dielectric film is removed from the KAPTON film and slitted to form 3 mm width films, which are analyzed by TMA for thermomechanical properties.

Example 11: Preparation and Application of Dielectric Film-Forming Composition 11

Dielectric film-forming composition of this example is prepared by mixing a cyclized polyisoprene (SC Rubber supplied by Fujifilm Electronic Materials U.S.A., 77.20 g of 28.5% solution in xylene), tricyclodecanedimethanol diacrylate (4.40 g), 2,2-bis(4-cyanatophenyl)propane (11.00 g), Mitsubishi silica (5.50 g), Irgacure® OXE01, (0.67 g), BTZ-AC (0.11 g), methacryloxypropyltrimethoxy silane (0.33 g), titanium carboxyethyl acrylate (0.11 g) and xylene (6.70 g) to obtain a homogeneous solution. The solution is filtered by using a 5.0 micron PTFE filter.

In this example, SC rubber is used as a cyclized polydiene, tricyclodecanedimethanol diacrylate is used as a reactive functional compound, 2,2-bis(4-cyanatophenyl)propane is used as a cyanate ester, Mitsubishi silica is used as a filler, Irgacure® OXE01 is used as a photoinitiator, BTZ-AC is used as a copper corrosion inhibitor, methacryloxypropyltrimethoxy silane is used as an adhesion promoter, titanium carboxyethyl acrylate is used as a curing catalyst, and xylene is used as a solvent.

The dielectric film-forming composition 11 is applied on a 35 micron thick PET film using an applicator to form a film. The film is baked at 100° C. for 12 minutes using a hot plate to remove the majority of the solvent. The film is then baked at 160° C. for 80 minutes under nitrogen to achieve a stable dielectric film with a thickness of 200 microns. After the dielectric film is lifted from the PET film, it is placed on a 25 micron KAPTON film and then baked at 240° C. for additional 45 minute under nitrogen.

After cooling to room temperature, the dielectric film is removed from the KAPTON film and slitted to form 3 mm width films, which are analyzed by TMA for thermomechanical properties.

Example 12: Preparation and Application of Dielectric Film-Forming Composition 12

Dielectric film-forming composition of this example is prepared by mixing a cyclized polyisoprene (SC Rubber supplied by Fujifilm Electronic Materials U.S.A., 77.20 g of 28.5% solution in xylene), tricyclodecanedimethanol diacrylate (4.40 g), AroCy®XU366 (11.00 g), Mitsubishi silica (5.50 g), Irgacure® OXE01, (0.67 g), BTZ-AC (0.11 g), methacryloxypropyltrimethoxy silane (0.33 g), titanium carboxyethyl acrylate (0.11 g) and xylene (6.7 g) to obtain a homogeneous solution. The solution is filtered by using a 5.0 micron PTFE filter.

In this example, SC rubber is used as a cyclized polydiene, tricyclodecanedimethanol diacrylate is used as a reactive functional compound, AroCyOXU366 is used as a cyanate ester compound, Mitsubishi silica is used as a filler, Irgacure® OXE01 is used as a photoinitiator, BTZ-AC is used as a copper corrosion inhibitor, methacryloxypropylt- rimethoxy silane is used as an adhesion promoter, titanium carboxyethyl acrylate is used as a curing catalyst, and xylene is used as a solvent.

The dielectric film-forming composition 12 is applied on a 35 micron thick PET film using an applicator to form a film. The film is baked at 80° C. for 15 minutes using a hot plate to remove the majority of the solvent. The film is then baked at 190° C. for 50 minutes under nitrogen to achieve a stable dielectric film with a thickness of 130 micron. After the dielectric film is lifted from the PET film, it is placed on a 25 micron KAPTON film and then baked at 210° C. for additional 1 hour under nitrogen.

After cooling to room temperature, the dielectric film is removed from the KAPTON film and slitted to form 3 mm width films, which are analyzed by TMA for thermomechanical properties.

Example 13: Preparation and Application of Dielectric Film-Forming Composition 13

Dielectric film-forming composition of this example is prepared by mixing a cyclized polyisoprene (SC Rubber supplied by Fujifilm Electronic Materials U.S.A., 77.20 g of 28.5% solution in xylene), tricyclodecanedimethanol diacrylate (4.40 g), Novolac (AroCy®XU371) (11.00 g), Mitsubishi silica (5.50 g), (Irgacure® OXE01, (0.67 g), BTZ-AC, (0.11 g), methacryloxypropyltrimethoxy silane (0.33 g), titanium carboxyethyl acrylate (0.11 g) and xylene (6.7 g) to obtain a homogeneous solution. The solution is filtered by using a 5.0 micron PTFE filter.

In this example, SC rubber is used as a cyclized polydiene, tricyclodecanedimethanol diacrylate is used as a reactive functional compound, Novolac (AroCy®XU371) is used as a cyanate ester compound, Mitsubishi silica is used as a filler, Irgacure® OXE01 is used as a photoinitiator, BTZ-AC is used as a copper corrosion inhibitor, methacryloxypropyltrimethoxy silane is used as an adhesion promoter, titanium carboxyethyl acrylate is used as a curing catalyst, and xylene is used as a solvent.

The dielectric film-forming composition 13 is applied on a 50 micron thick PET film using an applicator to form a film. The film is baked at 100° C. for 12 minutes using a hot plate to remove the majority of the solvent. The film is then baked at 250° C. for 1 hour under nitrogen to achieve a stable dielectric film with a thickness of 320 microns. After the dielectric film is lifted from the PET film, it is placed on a 25 micron KAPTON film and then baked at 250° C. for additional 70 minutes under nitrogen.

After cooling to room temperature, the dielectric film is removed from the KAPTON film and slitted to form 3 mm width films, which are analyzed by TMA for thermomechanical properties.

Example 14: Preparation and Application of Dielectric Film-Forming Composition 14

Dielectric film-forming composition of this example is prepared by mixing a cyclized polyisoprene (SC Rubber supplied by Fujifilm Electronic Materials U.S.A., 77.20 g of 28.5% solution in xylene), tricyclodecanedimethanol diacrylate (4.40 g), Novolac (Product Primaset® DT-4000) (11.00 g), Mitsubishi silica (5.50 g), Irgacure® OXE01, (0.67 g), BTZ-AC, (0.11 g), methacryloxypropyltrimethoxy silane (0.33 g), titanium carboxyethyl acrylate (0.11 g) and xylene (6.7 g) to obtain a homogeneous solution. The solution is filtered by using a 5.0 micron PTFE filter.

In this example, SC rubber is used as a cyclized polydiene, tricyclodecanedimethanol diacrylate is used as a reactive functional compound, Novolac (Product Primaset® DT-4000) is used as a cyanate ester compound, Mitsubishi silica is used as a filler, Irgacure® OXE01 is used as a photoinitiator, BTZ-AC is used as a copper corrosion inhibitor, methacryloxypropyltrimethoxy silane is used as an adhesion promoter, titanium carboxyethyl acrylate is used as a curing catalyst, and xylene is used as a solvent.

The dielectric film-forming composition 14 is applied on a 45 micron thick PET film using an applicator to form a film. The film is baked at 75° C. for 12 minutes using a hot plate to remove the majority of the solvent. The film is then baked at 160° C. for 55 minutes under nitrogen to achieve a stable dielectric film with a thickness of 100 microns. After the dielectric film is lifted from the PET film, it is placed on a 25 micron KAPTON film and is then baked at 210° C. for additional 1 hour under nitrogen.

After cooling to room temperature, the dielectric film is removed from the KAPTON film and slitted to form 3 mm width films, which are analyzed by TMA for thermomechanical properties.

Example 15: Preparation and Application of Dielectric Film-Forming Composition 15

Dielectric film-forming composition of this example is prepared by mixing a cyclized polydiene (Resiprene, 11.00 g), tricyclodecanedimethanol diacrylate (4.40 g), Novolac (Product Primaset® DT-4000) (11.00 g), Mitsubishi silica (5.50 g), Irgacure® OXE01, (0.67 g), BTZ-AC, (0.11 g), methacryloxypropyltrimethoxy silane (0.33 g), titanium carboxyethyl acrylate (0.11 g) and xylene (72.9 g) to obtain a homogeneous solution. The solution is filtered by using a 5.0 micron PTFE filter.

In this example, Resiprene is used as a cyclized polydiene, tricyclodecanedimethanol diacrylate is used as a reactive functional compound, Novolac (Product Primaset® DT-4000) is used as a cyanate ester compound, Mitsubishi silica is used as a filler, Irgacure® OXE01 is used as a photoinitiator, BTZ-AC is used as a copper corrosion inhibitor, methacryloxypropyltrimethoxy silane is used as an adhesion promoter, titanium carboxyethyl acrylate is used as a curing catalyst, and xylene is used as a solvent.

The dielectric film-forming composition 15 is applied on a 40 micron thick PET film using an applicator to form a film. The film is baked at 115° C. for 8 minutes using a hot plate to remove the majority of the solvent. The film is then baked at 170° C. for 70 minutes under nitrogen to achieve a stable dielectric film with a thickness of 120 microns. After the dielectric film is lifted from the PET film, it is placed on a 25 micron KAPTON film and then baked at 210° C. for additional 80 minutes under nitrogen.

After cooling to room temperature, the dielectric film is removed from the KAPTON film and slitted to form 3 mm width films, which are analyzed by TMA for thermomechanical properties.

Example 16: Preparation and Application of Dielectric Film-Forming Composition 16

Dielectric film-forming composition of this example is prepared by mixing cyclized polyisoprene (SC Rubber supplied by Fujifilm Electronic Materials U.S.A., 38.60 g of 28.5% solution in xylene), Resiprene (11.00 g, supplied by ESINE ITALIANE S.r.l.), tricyclodecanedimethanol diacrylate (2.2 g), hexane diacrylate (2.2 g), Novolac (AroCy®XU371) (11.00 g), Prismaset PT-3 (5.5 g), Mitsubishi silica (3.30 g), charged stabilized silica (2.20 g), Irgacure® OXE01 (0.33 g), dicumyl peroxide (3.30 g), 5-methyl benzotriazole (BTZ-AC, 0.11 g), methacryloxypropyltrimethoxy silane (0.33 g), xylene (27.60 g) and cyclopentanone (6.70 g) to obtain a homogeneous solution. The solution is filtered by using a 5.0 micron PTFE filter.

In this example, SC Rubber and Resiprene are used as two different cyclized polydiene polymers, tricyclodecanedimethanol diacrylate and hexane diacrylate are used as reactive functional compounds, Novolac (AroCy®XU371) and Primaset® PT-3 are used as cyanate ester compounds, Mitsubishi silica and charged stabilized silica are used as fillers, Irgacure® OXE01 is used as a photoinitiator, dicumyl peroxide is used as a thermal initiator, BTZ-AC is used as a copper corrosion inhibitor, methacryloxypropyltrimethoxy silane is used as an adhesion promoter, and xylene and cyclopentanone are used as solvents.

The dielectric film-forming composition 16 is applied on a 40 micron thick PET film using an applicator to form a film. The film is baked at 100° C. for 9 minutes using a hot plate to remove the majority of the solvent. The film is then baked at 160° C. for 75 minutes under nitrogen to achieve a stable dielectric film with a thickness of 130 microns. After the film is lifted from the PET film, it is placed on a 25 micron KAPTON film and then baked at 250° C. for additional 75 minutes under nitrogen.

After cooling to room temperature, the dielectric film is removed from the KAPTON film and slitted to form 3 mm width films, which are analyzed by TMA for thermomechanical properties.

Example 17: Preparation and Application of Dielectric Film-Forming Composition 17

Dielectric film-forming composition of this example is prepared by mixing cyclized polyisoprene (SC Rubber supplied by Fujifilm Electronic Materials U.S.A., 38.60 g of 28.5% solution in xylene), Resiprene 35, (11.00 g, supplied by ESINE ITALIANE S.r.l.), ALPEX CK 514/PAST (5.5 g, supplied by Allnex), tricyclodecanedimethanol diacrylate (2.2 g), hexane diacrylate (2.2 g), Novolac (AroCy®XU371, 11.00 g), charged stabilized silica (2.20 g), dicumyl peroxide (3.30 g), 5-methyl benzotriazole (BTZ-AC, 0.11 g), methacryloxypropyltrimethoxy silane (0.33 g), and cyclohexanone (26.70 g) to obtain a homogeneous solution. The solution is filtered by using a 5.0 micron PTFE filter.

In this example, SC Rubber, Resiprene, and ALPEX CK 514/PAST are used as three different cyclized polydiene polymers, tricyclodecanedimethanol diacrylate and hexane diacrylate are used as reactive functional compounds, Novolac (AroCy®XU371) is used as a cyanate ester compound, charged stabilized silica is used as a filler, dicumyl peroxide is used as a thermal initiator, BTZ-AC is used as a copper corrosion inhibitor, methacryloxypropyltrimethoxy silane is used as an adhesion promoter, and cyclohexanone is used as a solvent.

The dielectric film-forming composition 17 is applied on a 40 micron thick PET film using an applicator to form a film. The film is baked at 100° C. for 9 minutes using a hot plate to remove the majority of the solvent. The film is then baked at 160° C. for 75 minutes under nitrogen to achieve a stable dielectric film with thickness of 130 microns. The dielectric film is lifted from the PET film, it is placed on a 25 micron KAPTON film and then baked at 250° C. for additional 75 minutes under nitrogen.

After cooling to room temperature, the dielectric film is removed from the KAPTON film and slitted to form 3 mm width films, which are analyzed by TMA for thermomechanical properties.

Example 18: Preparation and Application of Dielectric Film-Forming Composition 18

Dielectric film-forming composition of this example is prepared by mixing cyclized polyisoprene (SC Rubber supplied by Fujifilm Electronic Materials U.S.A., 38.60 g of 28.5% solution in xylene), b-stage methacrylate-functionalized cycloolefin thermoset resin (Proxima®) (11.00 g), tricyclodecanedimethanol diacrylate (2.20 g), hexane diacrylate (2.20 g), Primaset® DT-4000 (11.00 g), Prismaset PT-3 (5.50 g), carbon black (3.30 g), charged stabilized silica (2.20 g), Irgacure® OXE01 (0.33 g), dicumyl peroxide (DCP, 3.30 g), 5-methyl benzotriazole (BTZ-AC, 0.11 g), methacryloxypropyltrimethoxy silane (0.33 g), xylene (27.60 g) and cyclopentanone (6.70 g) to obtain a homogeneous solution. The solution is filtered by using a 5.0 micron PTFE filter.

In this example, SC Rubber and b-stage methacrylate-functionalized cycloolefin thermoset resin (a polyolefin dielectric polymer) are used as two different cyclized polydiene polymers, tricyclodecanedimethanol diacrylate and hexane diacrylate are used as reactive functional compounds, Primaset® DT-4000 and Prismaset PT-3 are used as cyanate ester compounds, carbon black and charged stabilized silica are used as a filler, Irgacure® OXE01 is used as a photoinitiator, dicumyl peroxide is used as a thermal initiator, BTZ-AC is used as a copper corrosion inhibitor, methacryloxypropyltrimethoxy silane is used as an adhesion promoter, and xylene and cyclopentanone are used as solvents.

The dielectric film-forming composition 18 is applied on a 55 micron thick PET film using an applicator to form a film. The film is baked at 90° C. for 15 minutes using a hot plate to remove the majority of the solvent. The film is then baked at 170° C. for 70 minutes under nitrogen to achieve a stable dielectric film with a thickness of 220 microns. After the dielectric film is lifted from the PET film, it is placed on a 25 micron KAPTON film and then baked at 220° C. for additional 70 minutes under nitrogen.

After cooling to room temperature, the dielectric film is removed from the KAPTON film and slitted to form 3 mm width films, which are analyzed by TMA for thermomechanical properties.

Example 19: Preparation and Application of Dielectric Film-Forming Composition 19

Dielectric film-forming composition of this example is prepared by mixing a cyclized polyisoprene (SC Rubber supplied by Fujifilm Electronic Materials U.S.A., 77.20 g of 28.5% solution in xylene), tricyclodecanedimethanol diacrylate (4.40 g), Primaset® DT-4000 (11.00 g), polydiene particles (5.50 g), Irgacure® OXE01 (0.67 g), BTZ-AC (0.11 g), methacryloxypropyltrimethoxy silane (0.33 g), titanium carboxyethyl acrylate (0.11 g) and xylene (6.70 g) to obtain a homogeneous solution. The solution is filtered by using a 5.0 micron PTFE filter.

In this example, SC rubber is used as a cyclized polydiene, Primaset® DT-4000 is used as a cyanate ester compound, polydiene particles are used as a filler, tricyclodecanedimethanol diacrylate is used as a reactive functional compound, Irgacure® OXE01 is used as a photoinitiator, BTZ-AC is used as a copper corrosion inhibitor and catalyst, methacryloxypropyltrimethoxy silane is used as an adhesion promoter, titanium carboxyethyl acrylate is used as a curing catalyst, and xylene is used as a solvent.

The dielectric film-forming composition 19 is applied on a 60 micron thick PET film using an applicator to form a film. The film is baked at 120° C. for 6 minutes using a hot plate to remove the majority of the solvent. The film is baked at 200° C. for 50 minutes under nitrogen to achieve a stable dielectric film with a thickness of 350 microns. After the dielectric film is lifted from the PET film, it is placed on a 25 micron KAPTON film and then baked at 250° C. for additional 50 minutes under nitrogen.

After cooling to room temperature, the dielectric film is removed from the KAPTON film and slitted to form 3 mm width films, which are analyzed by TMA for thermomechanical properties.

Example 20: Preparation and Application of Dielectric Film-Forming Composition 20

Dielectric film-forming composition of this example is prepared by mixing a cyclized polyisoprene (SC Rubber supplied by Fujifilm Electronic Materials U.S.A., 77.20 g of 28.5% solution in xylene), tricyclodecanedimethanol diacrylate (4.40 g), Primaset® DT-4000 (11 g), carbon nanotube (CNT) (5.5 g), Irgacure® OXE01 (0.67 g), BTZ-AC (0.11 g), methacryloxypropyltrimethoxy silane (0.33 g), titanium carboxyethyl acrylate (0.11 g) and xylene (6.7 g) to obtain a homogeneous solution. The solution is filtered by using a 5.0 micron PTFE filter.

In this example, SC rubber is used as a cyclized polydiene, Novolac (Product Primaset® DT-4000) is used as a cyanate ester compound, carbon nanotube is used as a filler, Irgacure® OXE01 is used as a photoinitiator, BTZ-AC is used as a copper corrosion inhibitor, methacryloxypropyltrimethoxy silane is used as an adhesion promoter, titanium carboxyethyl acrylate is used as a curing catalyst, and xylene is used as a solvent.

The dielectric film-forming composition 20 is applied on a 40 micron thick PET film using an applicator to form a film. The film is baked at 85° C. for 11 minutes using a hot plate to remove the majority of the solvent. The film is then baked at 200° C. for 1 hour under nitrogen to achieve a stable dielectric film with a thickness of 400 microns. After the dielectric film is lifted from the PET film, it is placed on a 25 micron KAPTON film and then baked at 250° C. for additional 1 hour under nitrogen.

After cooling to room temperature, the dielectric film is removed from the KAPTON film and slitted to form 3 mm width films, which are analyzed by TMA for thermomechanical properties.

Example 21: Preparation and Application of Dielectric Film-Forming Composition 21

Dielectric film-forming composition of this example is prepared by mixing a cyclized polyisoprene (SC Rubber supplied by Fujifilm Electronic Materials U.S.A., 77.20 g of 28.5% solution in xylene), tricyclodecanedimethanol diacrylate (4.40 g), Primaset® DT-4000 (11.00 g), Mitsubishi Particles ($Fe_3O_4$, 5.50 g), Irgacure® OXE01 (0.67 g), BTZ-AC (0.11 g), methacryloxypropyltrimethoxy silane (0.33 g), zirconium carboxyethyl acrylate (0.11 g), and xylene (6.70 g) to obtain a homogeneous solution. The solution is filtered by using a 5.0 micron PTFE filter.

In this example, SC rubber is used as a cyclized polydiene polymer, Primaset® DT-4000 is used as a cyanate ester compound, Mitsubishi Particles are used as a filler, Irgacure® OXE01 is used as a photoinitiator, BTZ-AC is used as a copper corrosion inhibitor, methacryloxypropyltrimethoxy silane is used as an adhesion promoter, zirconium carboxyethyl acrylate is used as a curing catalyst, and xylene is used as a solvent.

The dielectric film-forming composition 21 is applied on a 50 micron thick PET film using an applicator to form a film. The film is baked at 85° C. for 13 minutes using a hot plate to remove the majority of the solvent. The film is then baked at 160° C. for 1 hour under nitrogen to achieve a stable dielectric film with a thickness of 180 microns. After the dielectric film is lifted from the PET film, it is placed on a 25 micron KAPTON film and then baked at 220° C. for additional 75 minutes under nitrogen.

After cooling to room temperature, the dielectric film is removed from the KAPTON film and slitted to form 3 mm width films, which are analyzed by TMA for thermomechanical properties.

Example 22: Preparation and Application of Dielectric Film-Forming Composition 22

Dielectric film-forming composition of this example is prepared by mixing a cyclized polyisoprene (SC Rubber supplied by Fujifilm Electronic Materials U.S.A., 77.20 g of 28.5% solution in xylene), tricyclodecanedimethanol diacrylate (4.40 g), Primaset® DT-4000 (11.00 g), alumina (5.50 g), Irgacure® OXE01 (0.67 g), BTZ-AC (0.11 g), glycidoxypropyltrimethoxy silane (Silquest A-187, 0.33 g), zirconium carboxyethyl acrylate (0.11 g), and xylene (6.70 g) to obtain a homogeneous solution. The solution is filtered by using a 5.0 micron PTFE filter.

In this example, SC rubber is used as a cyclized polydiene, tricyclodecanedimethanol diacrylate is used as a reactive functional compound, Primaset® DT-4000 is used as a cyanate ester compound, alumina is used as a filler. Irgacure® OXE01 is used as a photoinitiator, BTZ-AC is used as a copper corrosion inhibitor, glycidoxypropyltrimethoxy silane is used as an adhesion promoter, zirconium carboxyethyl acrylate is used as a curing catalyst, and xylene is used as a solvent.

The dielectric film-forming composition 22 is applied on a 45 micron thick PET film using an applicator to form a film. The film is baked at 95° C. for 10 minutes using a hot plate to remove the majority of the solvent. The film is then baked at 180° C. for 1 hour under nitrogen to achieve a stable dielectric film with a thickness of 100 microns. After the dielectric film is lifted from the PET film, it is placed on a 25 micron KAPTON film and then baked at 225° C. for additional 65 minutes under nitrogen.

After cooling to room temperature, the dielectric film is removed from the KAPTON film and slitted to form 3 mm width films, which are analyzed by TMA for thermomechanical properties.

Example 23: Preparation and Application of Dielectric Film-Forming Composition 23

Dielectric film-forming composition of this example is prepared by mixing a cyclized polyisoprene (SC Rubber supplied by Fujifilm Electronic Materials U.S.A., 77.2 g of 28.5% solution in xylene), tricyclodecanedimethanol diacrylate (4.40 g), Novolac (AroCy®XU371) (11.00 g), copper particles (5.50 g), Irgacure® OXE01 (0.67 g), BTZ-AC (0.11 g), methacryloxypropyltrimethoxy silane (0.33 g), zirconium carboxyethyl acrylate (0.11 g) and xylene (6.70 g) to obtain a homogeneous solution. The solution is filtered by using a 5.0 micron PTFE filter.

In this example, SC rubber is used as a cyclized polydiene, tricyclodecanedimethanol diacrylate is used as a reactive functional compound. Novolac (AroCy®XU371) is used as a cyanate ester compound, copper particles are used as a filler, Irgacure® OXE01 is used as a photoinitiator, BTZ-AC is used as a copper corrosion inhibitor, methacryloxypropyltrimethoxy silane is used as an adhesion promoter, zirconium carboxyethyl acrylate is used as a curing catalyst, and xylene is used as a solvent.

The dielectric film-forming composition 23 is applied on a 50 micron thick PET film using an applicator to form a film. The film is baked at 100° C. for 12.5 minutes using a hot plate to remove the majority of the solvent. The film is baked at 175° C. for 75 minutes under nitrogen to achieve a stable dielectric film with a thickness of 180 microns. After the film is lifted from the PET film, it is placed on a 25 um KAPTON film and then baked at 225° C. for additional 75 minutes under nitrogen.

After cooling to room temperature, the dielectric film is removed from the KAPTON film and slitted to form 3 mm width films, which are analyzed by TMA for thermomechanical properties.

Example 24: Preparation and Application of Dielectric Film-Forming Composition 24

Dielectric film-forming composition of this example is prepared by mixing a cyclized polyisoprene (SC Rubber supplied by Fujifilm Electronic Materials U.S.A., 38.60 g of 28.5% solution in xylene), Resiprine (5.50 g), tricyclodecanedimethanol diacrylate (2.20 g), hexane diacrylate (2.20 g), 2,2-bis(4-cyanatophenyl)propane (3.60 g), Primaset® DT-4000 (3.66 g), Primaset® PT30 (3.66 g), Irgacure® OXE01 (0.33 g), dicumyl peroxide (DCP, 3.30 g), 5-methyl benzotrazole (MBTA, 0.11 g), BTZ-AC (0.11 g), methacryloxypropyltrimethoxy silane (0.11 g), glycidoxypropyltrimethoxy silane (Silquest A-187, 0.22 g), titanium carboxyethyl acrylate (0.11 g), a 0.5% solution of Polyfox 3260 in cyclopentanone (0.11 g), a solution of 0.015% naphthalene sulfonic salt of Victoria Blue Dye in cyclopentanone (1.00 g solution), poly(bisphenol A carbonate) (1.00 g), xylene (6.70 g), mesitylene 20.00 g), and cyclohexanone (7.60 g) to obtain a homogeneous solution. The solution is filtered by using a 5.0 micron PTFE filter.

In this example, SC Rubber and Resiprene are used as two different cyclized polydiene polymers, tricyclodecanedimethanol diacrylate and hexane diacrylate are used as reactive functional compounds, 2,2-bis(4-cyanatophenyl)propane, Primaset® DT-4000, and Primaset® PT30 are used as cyanate ester compounds, Irgacure® OXE01 is used as a photoinitiator, dicumyl peroxide is used as a thermal initiator, MBTA and BTZ-AC are used as copper corrosion inhibitors, methacryloxypropyltrimethoxy silane and glycidoxypropyltrimethoxy silane are used as adhesion promoters, titanium carboxyethyl acrylate is used as a curing catalyst, Polyfox 3260 is used as a surfactant, naphthalene sulfonic salt of Victoria Blue is used as a dye, poly(bisphenol A carbonate) is used as a binding material to reduce dielectric loss, and xylene, mesitylene, and cyclohexanone are used as solvents.

The dielectric film-forming composition 24 is applied on a 40 micron thick PET film using an applicator to form a film. The film is baked at 100° C. for 10 minutes using a hot plate to remove the majority of the solvent. The film is then baked at 175° C. for 70 minutes under nitrogen to achieve a stable dielectric film with a thickness of 140 microns. After the dielectric film is lifted from the PET film, it is placed on a 25 micron KAPTON film and then baked at 220° C. for additional 1 hour under nitrogen.

After cooling to room temperature, the dielectric film is removed from the KAPTON film and slitted to form 3 mm width films, which are analyzed by TMA for thermomechanical properties.

Example 25: Preparation and Application of Dielectric Film-Forming Composition 25

Dielectric film-forming composition of this example is prepared by mixing a cyclized polydiene (Resiprene, 11.00 g) and AroCy®L-10 (11.00 g), and warmed to 50° C. to obtain a homogeneous solution. After cooling to the room, the solution is filtered by using a 5.0 micron PTFE filter.

In this example, Resiprene is used as a cyclized polydiene polymer and AroCy®L-10 is used as a cyanate ester compound.

The dielectric film-forming composition 25 is applied on a 40 micron thick PET film using an applicator to form a film. The film is baked at 115° C. for 8 minutes using a hot plate to remove the majority of the solvent. The film is baked at 170° C. for 70 minutes under nitrogen to achieve a stable dielectric film with a thickness of 120 microns. After the film is lifted from the PET film, it is placed on a 25 micron KAPTON film and then baked at 210° C. for additional 80 minutes under nitrogen.

After cooling to room temperature, the dielectric film is removed from the KAPTON film and slitted to form 3 mm width films, which are analyzed by TMA for thermomechanical properties.

Example 26: Preparation of Fine and Ultrafine Cu Lines in Polyolefin Cyanate Ester Dielectric A dielectric film-forming composition is prepared by mixing a cyclized polyisoprene (SC Rubber supplied by Fujifilm Electronic Materials U.S.A. 57.90 g of 28.5% solution in xylene), tricyclodecanedimethanol diacrylate (3.30 g), 2,2-bis(4-cyanatophenyl)propane (8.25 g), dicumyl peroxide (0.50 g) and xylene (25.20 g) to obtain a homogeneous solution. The solution is filtered by using a 5.0 micron PTFE filter.

The solution is spin-coated on a 100 mm PVD-copper wafer to form a film. This film is then baked at 115° C. for 6 minutes using a hot plate. The film is then baked at 250° C. for 2 hours under nitrogen to form a dielectric film with thickness of about 3 microns.

TIS193IL-A01 supplied by Fujifilm Electronic Materials USA is spin coated on top of the dielectric film of this example to form a silicon containing resist layer. The silicon containing resist layer is baked at 135° C. for 90 seconds on a hot plate to remove most of the solvent and to complete the preparation of the stack of dielectric film and silicon containing resist layer.

The TIS193L-A01 layer is exposed with a Canon 248-nm stepper (NA 0.65, SIGMA 2 (Annular)) through a trench test pattern reticle 1 at a fixed dose of 77 mJ/cm$^2$ and 0 μm fixed focus. The exposed silicon containing resist layer is baked at 125° C. for 90 seconds and developed by 2.38N TMAH for 60 seconds to resolve trenches of dimensions of 10 μm and below including ultrafine 2 μm trench patterns as observed by an optical microscope. The wafer is cleaved into a 2 inch×2 inch square coupon. The ultrafine trench pattern is transferred to the dielectric film by etching with oxygen plasma for 5 minutes at Rf of 250 W and oxygen gas flow rate of 15 sccm.

Example 27: Preparation of Dry Film

Dielectric film-forming composition of this example was prepared by mixing a cyclized polyisoprene (SC Rubber supplied by Fujifilm Electronic Materials U.S.A., 360 g of 28.5% solution in xylene), tricyclodecanedimethanol diacrylate (20.52 g), 2,2-bis(4-cyanatophenyl)propane (51.30 g), dicumyl peroxide (3.08 g), methacryloxypropyltrimethoxy silane (3.08 g), BTZ-AC (1.03 g) and xylene (162.1 g) to obtain a homogeneous solution. The solution was filtered by using a 0.2 micron PTFE filter.

The above dielectric film-forming composition was applied using slot die coater from Fujifilm USA (Greenwood, SC) with a line speed of 2 feet/minute (61 cm per minute) with 60 microns clearance onto a polyethylene terephthalate (PET) film (TCH21, manufactured by DuPont Teijin Films USA) having a width of 16.2" and thickness of 36 microns used as a carrier substrate and dried at 194° F. to obtain a film with a thickness of approximately 32.3 microns (Dry Film-1). On this polymeric layer, a biaxially oriented polypropylene film having a width of 16" and a thickness of 30 microns (BOPP, manufactured by Impex Global, Houston, TX) was laid over by a roll compression to act as a protective layer.

After the removal of the protective layer by peeling, two dry films (Dry Film-1) (6"×6") were stacked together and were placed on 12×12" steel plate. The films were successfully laminated by vacuum lamination (0.2-0.4 Torr) for 20 seconds, followed by being subjected to both a pressure of 40 psi and vacuum of 0.2-0.4 Torr for 180 seconds. The lamination temperature was 60° C. Lamination process was done by using a DPL-24A Differential Pressure Laminator manufactured by OPTEK, NJ. This process was repeated 11 times.

A thick film was obtained by laminating 12 layers of Dry Film-1 The film was then baked at 150° C. for 1 hour under nitrogen to achieve a stable dielectric film with a thickness of 350 microns. After the dielectric film was lifted from the PET film, it was placed on a 25 micron KAPTON film and then baked at 200° C. for additional 1 hour under nitrogen.

This thick film is used for dielectric properties measurement (Dk and Df).

Example 28: Formation of Three-Dimensional Object

The dielectric film-forming composition of Example 4 is spin-coated at 1200 rpm onto a silicon oxide wafer with copper-plated line/space/height pattern ranging from 8/8/6 microns to 15/15/6 microns. The coated film is baked at 95° C. for 5 minutes using a hot plate to form a film having a thickness of about 13 microns. The photosensitive composition is then blanket exposed at 500 mJ/cm$^2$ by using an LED i-line exposure tool. The photosensitive composition is cured at 170° C. for 2 hours in a YES oven. Thus a three-dimensional object where individual copper structures are surrounded by the dielectric film is prepared.

Example 29: Copper Deposition

The dielectric film-forming composition of Example 4 is spin-coated at 1200 rpm onto a PVD-copper wafer. This film is then baked at 95° C. for 6 mins using a hot plate to produce a photosensitive composition film with a thickness of 8 microns. The photosensitive composition film is exposed with a Canon i-line stepper (NA 0.45, SIGMA 0.7) through a trench test pattern reticle at a fixed dose of 500 mJ/cm$^2$ and −1 micron fixed focus. The exposed photosensitive layer is then developed by using dynamic development of cyclopentanone for 40 seconds to resolve trenches of dimensions of 50 microns and below including ultrafine 4 microns trench pattern as observed by an optical microscope (and confirmed by cross-section scanning electron microscope (SEM). The photosensitive composition is cured at 170° C. for 2 hours in a YES oven.

The wafer is then electroplated and 3.0 microns high copper lines are produced in all trenches as observed by SEM. Electrodeposition of copper is achieved using the electrolyte composition consisting of copper ion (30 g/L), sulfuric acid (50 g/L), chloride ion (40 ppm), poly(propylene glycol) (500 ppm), disodium 3,3-dithiobis(1-propanesulfonate (200 ppm) and bis(sodium sulfopropyl) disulfide (100 μm). Electroplating is performed in a beaker while stirring using the following conditions: Anode: Copper; Plating temperature: 25° C.; Current density: 10 mA/cm$^2$; and Time: 2 minutes. After electroplating, the fine trenches are cut and the copper filling conditions are inspected using optical and scanning electron microscopes to confirm that the copper is completely filled without any voids. Also the time of deposition is controlled to avoid formation of overburden.

Example 30: Moisture Permeability Test 25 g of desiccant (CaCl$_2$) was placed in an EZ-cup and it was covered with the dielectric film prepared from Example 1, 4, or 8 with a diameter of 63.5 mm. The EZ-cup was then sealed with the threaded flanged ring between the two neoprene gaskets and placed in a climate chamber (40° C.; 90% RH) for 24 hours. The weight of EZ-cup assembled with the dielectric film was measured before and after storage in the climate chamber. Water Vapor Transmission (WVT) is calculated according to the following: WVT=G/(t×A), in which G is weight change (g); t is time (h), and A is the area of the dielectric film (m$^2$); G/t=slope of the straight line, grains/h; and WVT=rate of water vapor transmission, grains/h·m$^2$.

TABLE 2

Moisture Permeability of Film

| Sample No# | WVT/um Water Vapor Transmission (WVT) |
|---|---|
| Film Example 1 | 0.075 |
| Film Example 4 | 0.05 |
| Film Example 8 | 0.03 |

As shown in Table 2, the films prepared in Examples 1, 4, and 8 exhibited low water vapor transmission or moisture permeability.

The invention claimed is:

1. A process comprising applying a composition to a substrate, wherein the composition is a dielectric film-forming composition, comprising:
   at least one cyclized polydiene resin having a substituted or unsubstituted alkenyl group;
   at least one reactive functional compound having at least two functional groups capable of reacting with the substituted or unsubstituted alkenyl group on cyclized polydiene resin; and
   at least one catalyst capable of inducing reaction of the cyclized polydiene resin with the reactive functional compound, wherein the applying comprises:
   a) coating the dielectric film-forming composition on the substrate to form a film; and wherein the process further comprises:
   b) optionally baking the film at a temperature from about 50° C. to about 150° C. for about 20 seconds to about 240 seconds; and
   c) exposing the film to radiation, heat, or a combination thereof without a mask.

2. The process of claim 1, wherein the at least one cyclized polydiene resin comprises a cyclized polyisoprene, a cyclized polybutadiene, a cyclized polypentadiene, or a copolymer thereof.

3. The process of claim 1, wherein the at least one cyclized polydiene resin has a weight average molecular weight (Mw) of from at least about 5,000 Daltons to at most about 500,000 Daltons.

4. The process of claim 1, wherein the at least one cyclized polydiene resin is a mixture of:
   a) a cyclized polydiene resin with a weight average molecular weight of from about 5,000 Daltons to about 20,000 Daltons;
   b) a cyclized polydiene resin with a weight average molecular weight of from about 25,000 Daltons to about 60,000 Daltons; and
   c) a cyclized polydiene resin with a weight average molecular weight of from about 70,000 Daltons to about 200,000 Daltons.

5. The process of claim 1, wherein the at least one cyclized polydiene resin is in an amount of from about 2 wt % to about 40 wt % of the composition.

6. The process of claim 1, wherein the dielectric film-forming composition is capable of forming a dielectric film having a Tg of at least about 120° C.

7. The process of claim 1, wherein the at least one of the reactive functional compound comprises a compound containing at least two functional groups selected from the groups consisting of a (meth)acrylate group, an olefin group, a cycloolefin group, an alkynyl group, and a combination thereof.

8. The process of claim 1, wherein the at least one reactive functional compound is in an amount of from about 1 wt % to about 25 wt % of the composition.

9. The process of claim 1, wherein the at least one catalyst is in an amount of from about 0.2 wt % to about 3 wt % of the composition.

10. A process comprising applying a composition to a substrate, wherein the composition is a dielectric film-forming composition, comprising:
   at least one cyclized polydiene resin having a substituted or unsubstituted alkenyl group;
   at least one reactive functional compound having at least two functional groups capable of reacting with the substituted or unsubstituted alkenyl group on cyclized polydiene resin; and at least one catalyst capable of inducing reaction of the cyclized polydiene resin with the reactive functional compound, wherein the applying comprises
  a) coating the substrate with the dielectric film-forming composition, wherein the substrate is a carrier substrate;
  and wherein the process further comprises:
  b) drying the coated dielectric film-forming composition to form a dry film; and
  c) optionally, applying a protective layer to the dry film.

11. A dry film prepared by the process of claim 10.

12. A process comprising applying a composition to a substrate, wherein the composition is a dielectric film-forming composition, comprising:
  at least one cyclized polydiene resin having a substituted or unsubstituted alkenyl group;
  at least one reactive functional compound having at least two functional groups capable of reacting with the substituted or unsubstituted alkenyl group on cyclized polydiene resin; and
  at least one catalyst capable of inducing reaction of the cyclized polydiene resin with the reactive functional compound, wherein the process is a process for depositing a conducting metal layer and the applying comprises
    a) depositing the dielectric-film forming composition on the substrate to form a dielectric film;
  and wherein the process further comprises:
    b) exposing the dielectric film to radiation or heat or a combination of radiation and heat;
    c) patterning the dielectric film to form a patterned dielectric film having openings;
    d) optionally depositing a seed layer on the patterned dielectric film;
    e) depositing a conducting metal layer in at least one opening in the patterned dielectric film; and
    f) optionally repeating steps a) to e) at least one time.

13. A process comprising applying a composition to a substrate, wherein the composition is a dielectric film-forming composition, comprising:
  at least one cyclized polydiene resin having a substituted or unsubstituted alkenyl group;
  at least one reactive functional compound having at least two functional groups capable of reacting with the substituted or unsubstituted alkenyl group on cyclized polydiene resin; and
  at least one catalyst capable of inducing reaction of the cyclized polydiene resin with the reactive functional compound, comprising:
    a) providing the substrate as a substrate containing conducting metal wire structures that form a network of lines and interconnects on the substrate;
  and wherein the applying comprises
    b) depositing the dielectric film-forming composition on the substrate to form a dielectric film;
  and wherein the process further comprises:
    c) exposing the dielectric film to radiation or heat or a combination of radiation and heat; and
    d) optionally, repeating steps a) to c) at least one time.

14. A three dimensional object formed by the process of claim 13.

15. The object of claim 14, comprising the dielectric film in at least two stacks.

16. The process of claim 10, wherein the at least one cyclized polydiene resin is in an amount of from about 2 wt % to about 40 wt % of the composition.

17. The process of claim 12, wherein the at least one cyclized polydiene resin is in an amount of from about 2 wt % to about 40 wt % of the composition.

18. The process of claim 13, wherein the at least one cyclized polydiene resin is in an amount of from about 2 wt % to about 40 wt % of the composition.

* * * * *

UNITED STATES PATENT AND TRADEMARK OFFICE
CERTIFICATE OF CORRECTION

PATENT NO. : 12,338,309 B2
APPLICATION NO. : 18/594248
DATED : June 24, 2025
INVENTOR(S) : Binod B. De et al.

Page 1 of 1

It is certified that error appears in the above-identified patent and that said Letters Patent is hereby corrected as shown below:

In the Claims

Column 36
In Claim 12, Line 2, after "patterned dielectric" insert -- film; and --
In Claim 12, Line 3, delete "film; and"

Signed and Sealed this
Second Day of September, 2025

Coke Morgan Stewart
*Acting Director of the United States Patent and Trademark Office*